(12) United States Patent
Kinoshita

(10) Patent No.: US 6,845,056 B2
(45) Date of Patent: Jan. 18, 2005

(54) SEMICONDUCTOR MEMORY DEVICE WITH REDUCED POWER CONSUMPTION

(75) Inventor: Mitsuya Kinoshita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 227 days.

(21) Appl. No.: 10/325,827

(22) Filed: Dec. 23, 2002

(65) Prior Publication Data

US 2004/0008563 A1 Jan. 15, 2004

(30) Foreign Application Priority Data

Jul. 9, 2002 (JP) ...................................... 2002-200136

(51) Int. Cl.[7] .............................................. G11C 8/00
(52) U.S. Cl. .............................. 365/230.03; 365/230.06
(58) Field of Search ....................... 365/230.03, 230.06, 365/230.08, 194, 205, 204

(56) References Cited

U.S. PATENT DOCUMENTS 5,831,921 A 11/1998 Tsukude
5,959,924 A 9/1999 Son et al.
6,529,439 B2 * 3/2003 Uchida et al. ......... 365/230.06

FOREIGN PATENT DOCUMENTS

| JP | 5-314766 | 11/1993 |
| JP | 9-161477 | 6/1997 |

* cited by examiner

Primary Examiner—David Lam
(74) Attorney, Agent, or Firm—Leydig, Voit & Mayer, Ltd.

(57) ABSTRACT

In a semiconductor memory device having a shared sense amplifier configuration, a control circuit outputting a bit line isolation signal latches a block selection signal in accordance with a change in a trigger signal. With this configuration, when the same block is selected, no change is caused in the bit line isolation signal. Consequently, charge/discharge current is reduced, and power consumption is reduced. Since a specific bit in a refresh counter is not used, unlike the conventional technique, the design changes little even in the case of changing the configuration of an array.

7 Claims, 21 Drawing Sheets

US 6,845,056 B2

SEMICONDUCTOR MEMORY DEVICE WITH REDUCED POWER CONSUMPTION

BACKGROUND OF THE INVENTION

1. Field of the Invention

The present invention relates to a semiconductor memory device, and more particularly to a control for isolating a bit line and a sense amplifier from each other in a dynamic random access memory (DRAM) having a shared sense amplifier configuration.

2. Description of the Background Art

Reduction in power consumption is being demanded in a DRAM when the DRAM is mounted to a battery driven device. In the case where the DRAM has a shared sense amplifier configuration, by fixing a bit line isolation signal while the same memory block is refreshed, at the time of self refresh of a DRAM, charge/discharge current of a gate for isolating the shared sense amplifier from the memory block can be reduced.

For example, FIGS. 14 and 15 of Japanese Patent Laying-Open No. 9-161477 show the configuration that an output C8 of a specific digit of a refresh counter is used and, during self refresh, only when C8 changes, a bit line isolation signal BLI is changed.

However, in a DRAM, the configuration of a memory cell array has to be often changed. Particularly, in a system LSI having therein a DRAM as a block (also referred to as an embedded DRAM), in many cases, the configuration of a memory cell array has to be changed according to the system installed.

When the charge/discharge current is reduced by the conventional method of controlling bit line isolation signal BLI in accordance with a specific digit of a refresh counter, inconvenience is caused at the time of changing the configuration of the memory cell array.

Specifically, each time the configuration of the memory cell array is changed, the corresponding relation between the digit of an address signal and the row and column of the memory cell array changes. Consequently, at the time of realizing various array configurations, the digit of a self refresh counter to be referred to changes and a problem arises such that the layout pattern of a circuit has to be changed.

In the conventional configuration, in a normal mode, even in the case of successively accessing only the same memory block, bit line signal BLI is changed every cycle bit. Consequently, there is also a problem such that unnecessary charge/discharge current flows even in a normal operation mode and the power consumption is large.

SUMMARY OF THE INVENTION

An object of the present invention is to make a change in a self refresh circuit unnecessary at the time of realizing various configurations of a memory cell array. Another object of the present invention is to reduce charge/discharge current in a parasitic capacity of an isolation gate driven by a bit line isolation signal even in a normal operation mode.

The present invention is directed to, in short, a semiconductor memory device including first and second memory blocks, a sense amplifier, an isolation gate circuit, a control circuit, and an isolation control unit.

Each of the first and second memory blocks includes a plurality of memory cells arranged in a matrix. The sense amplifier is shared by the first and second memory blocks. The isolation gate circuit connects one of the first and second memory blocks to the sense amplifier and isolates the other memory block from the sense amplifier at the time of transmitting/receiving data. The control circuit decodes an address signal, outputs first and second selection signals indicative of selection of the first and second memory blocks and, according to a command, outputs a trigger signal indicative of a timing of activating a row of either one of the first and second memory block. The isolation control unit outputs a first isolation gate signal for isolating the first memory block from the sense amplifier band and a second isolation gate signal for isolating the second memory block from the sense amplifier band to the isolation gate circuit in accordance with the trigger signal and the first and second selection signals.

The isolation control unit includes first and second holding circuits.

The first holding circuit latches and holds the first selection signal in accordance with the trigger signal. The second holding circuit latches and holds the second selection signal in accordance with the trigger signal.

Therefore, a main advantage of the present invention is that, since the bit line isolation signal is not changed during the same block is accessed, the number of charging/discharging times of a gate portion in an isolation gate is decreased, and power consumption can be reduced.

Another advantage of the present invention is that, since an output of a refresh counter is not used for a control on a bit line isolation signal even when the array configuration such as the number of word lines constructing a memory block or the number of memory blocks is changed, it is unnecessary to change the refresh control circuit, so that the memory array configuration can be easily flexibly changed according to specifications.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
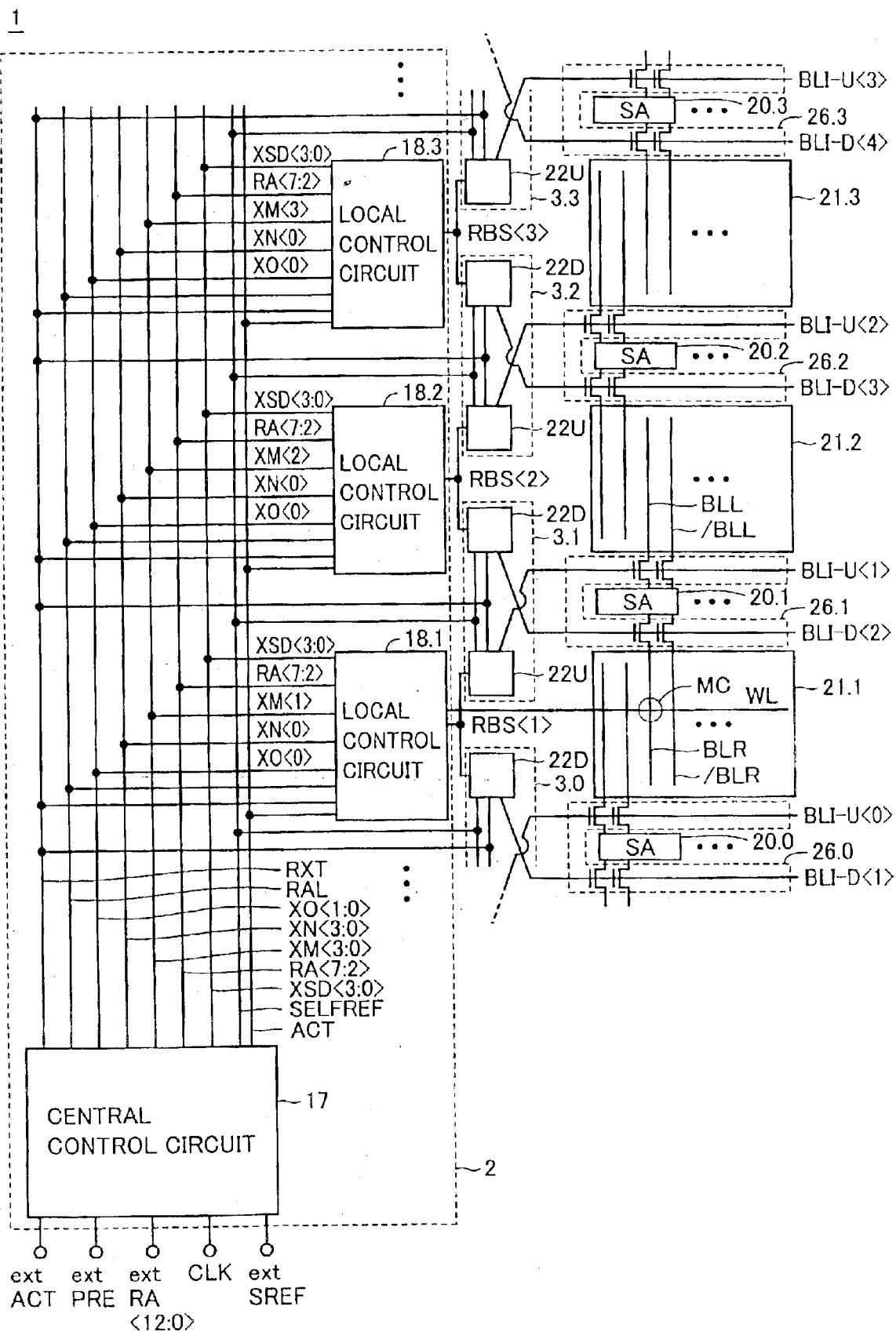
FIG. 1 is a block diagram showing a schematic configuration of a whole semiconductor memory device 1 of an embodiment of the present invention.

Hereinafter, embodiments of the present invention will be described in detail with reference to the drawings. The same reference numeral denotes the same or corresponding parts.

Description of General Configuration

FIG. 1 is a block diagram showing the general schematic configuration of a semiconductor memory device 1 of an embodiment.

Referring to FIG. 1, semiconductor memory device 1 includes: memory blocks 21.1, 21.2, 21.3, . . . each including a plurality of memory cells arranged in a matrix; a plurality of sense amplifiers 20.0, 20.1, 20.2, 20.3, . . . each shared by two neighboring memory blocks; and isolation gate circuits 26.0, 26.1, 26.2, 26.3, . . . each for connecting one of neighboring two memory blocks to a corresponding sense amplifier and isolating the other memory block from the corresponding amplifier at the time of transmission/reception of data.

Semiconductor memory device 1 further includes: a control circuit 2 for decoding address signals extRA<12:0>, outputting block selection signals RBS<1>, RBS<2>, RBS<3>, . . . indicative of selection of a memory block, and outputting a trigger signal RXT indicative of a timing of activating a row of any of the memory blocks in accordance with control signal extACT indicative of a command, signals extPRE and extSREF, and a clock signal CLK; and bit line isolation control circuits 3.0, 3.1, 3.2, 3.3, . . . for outputting bit line isolation signals BLI-U<0> to BLI-U<3>, and BLI-D<1> to BLI-D<4> to isolation gate circuits 26.0 to 26.3.

Control circuit 2 includes a central control circuit 17 and local control circuits 18.1, 18.2, 18.3, . . . .

Bit line isolation control circuit 3.1 includes: a holding circuit 22U for latching and holding block selection signal RBS<1> in accordance with signals RXT and SELFREF and outputting signal BLI-U<1>; and a holding circuit 22D for latching and holding block selection signal RBS<2> in accordance with signals RXT and SELFREF and outputting signal BLI-D<2>.

Bit line isolation control circuit 3.2 has a configuration similar to that of bit line isolation control circuit 3.1, in which holding circuit 22U latches and holds block selection signal RBS<2> in accordance with signals RXT and SELFREF and outputs signal BLI-U<2>, and holding circuit 22D latches and holds block selection signal RBS<3> in accordance with signals RXT and SELFREF and outputs signal BLI-D<3>.

Figure 2:
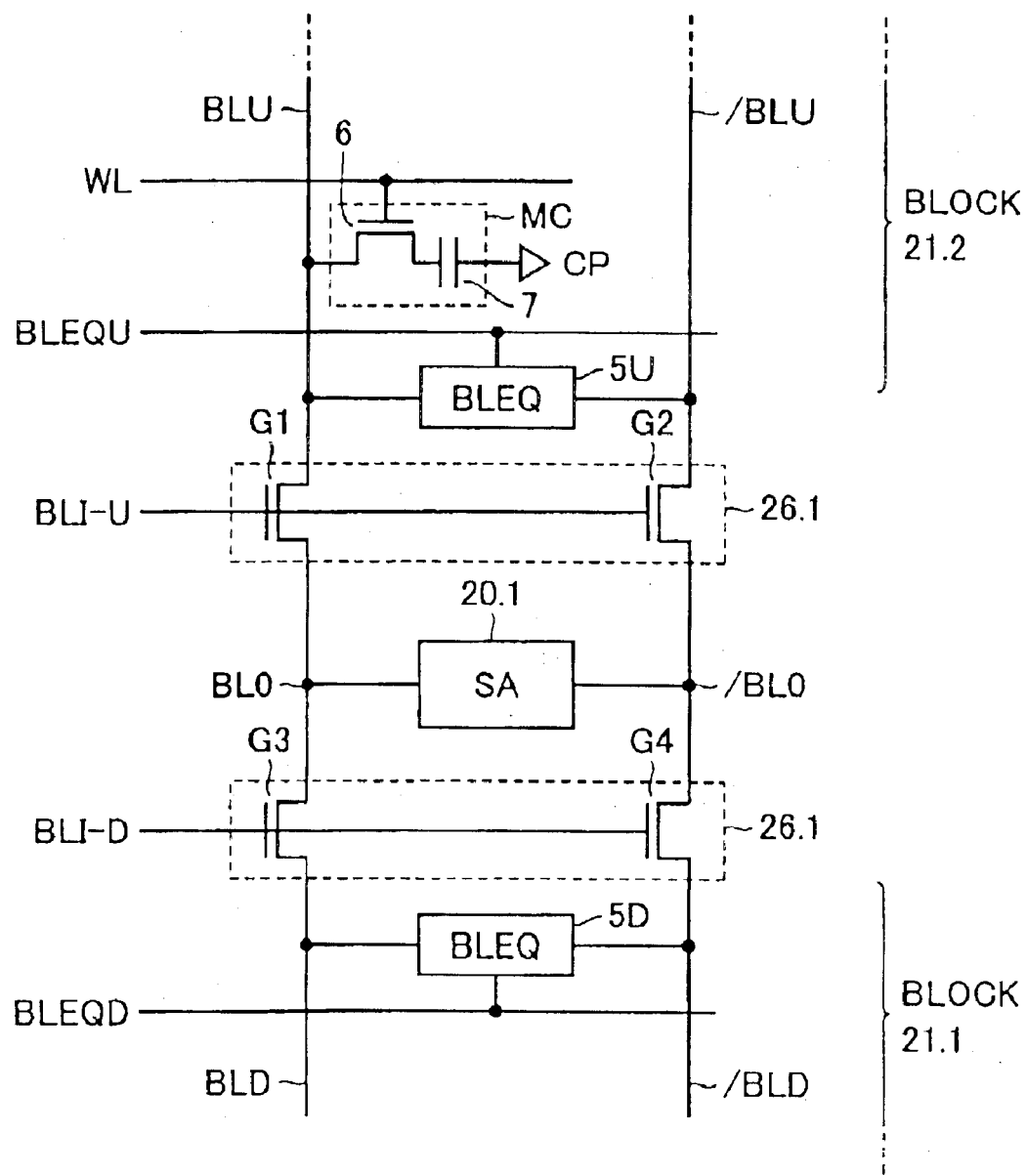
FIG. 2 is a circuit diagram for more specifically describing the periphery of a connection portion of a sense amplifier shared by memory blocks 21.1 and 21.2 in FIG. 1.

FIG. 2 is a circuit diagram for more specifically describing the periphery of the connection portion of the sense amplifier shared by memory blocks 21.1 and 21.2 in FIG. 1.

Referring to FIG. 2, the shared sense amplifier type memory cell array will be briefly described. Memory cells are disposed in two blocks 21.1 and 21.2, and blocks 21.1 and 21.2 share a sense amplifier band. In a connection portion between blocks 21.1 and 21.2, the sense amplifier band is disposed. As described above, the configuration such that addresses which are not accessed at the same time are provided in different blocks and the sense amplifier is shared by the plurality of blocks will be called a shared sense amplifier type memory cell array.

The connection portion includes: sense amplifier 20.1 for amplifying and outputting a potential difference between bit lines BL0 and /BL0; isolation gate circuit 26.1 for connecting bit lines BL0 and /BL0 to bit lines BLU and /BLU, respectively, in accordance with bit line isolation signal BLI-U, and connecting bit lines BL0 and /BL0 to bit lines BLD and /BLD, respectively, in accordance with bit line isolation signal BLI-D; an equalize circuit 5U for equalizing the potentials of bit lines BLU and /BLU in accordance with an equalize signal BLEQU; and an equalize circuit 5D for equalizing the potentials of bit lines BLD and /BLD in accordance with an equalize signal BLEQD. A memory cell MC is provided at an intersecting point of a bit line and a word line.

Isolation gate circuit 26.1 includes: an N-channel MOS transistor G1 connected between bit lines BL0 and BLU and whose gate receives bit line isolation signal BLI-U; an N-channel MOS transistor G2 connected between bit lines /BL0 and /BLU and whose gate receives bit line isolation signal BLI-U; an N-channel MOS transistor G3 connected between bit lines BL0 and BLD and whose gate receives bit line isolation signal BLI-D; and an N-channel MOS transistor G4 connected between bit lines /BL0 and /BLD and whose gate receives bit line isolation, signal BLI-D.

In practice, a plurality of word lines are disposed in each of blocks 21.1 and 21.2. FIG. 2 shows, however, a representative word line and a representative memory cell. Memory cell MC includes: an access transistor 6 connected between bit line BLU and a storage node and having a gate connected to a word line; and a capacitor 7 provided between the storage node and a cell plate CP.

Although not shown, equalize circuit 5U includes: a first N-channel MOS transistor which is usually made conductive according to equalize signal BLEQU to connect bit lines BLU and /BLU; a second N-channel MOS transistor for connecting bit line BLU to a bit line precharge potential VBL which is usually the same as the cell plate potential; and a third N-channel MOS transistor for connecting bit line /BLU to bit line precharge potential VBL as the same potential as the cell plate potential. Equalize circuit 5D has a configuration similar to that of equalize circuit 5U.

Figure 3:
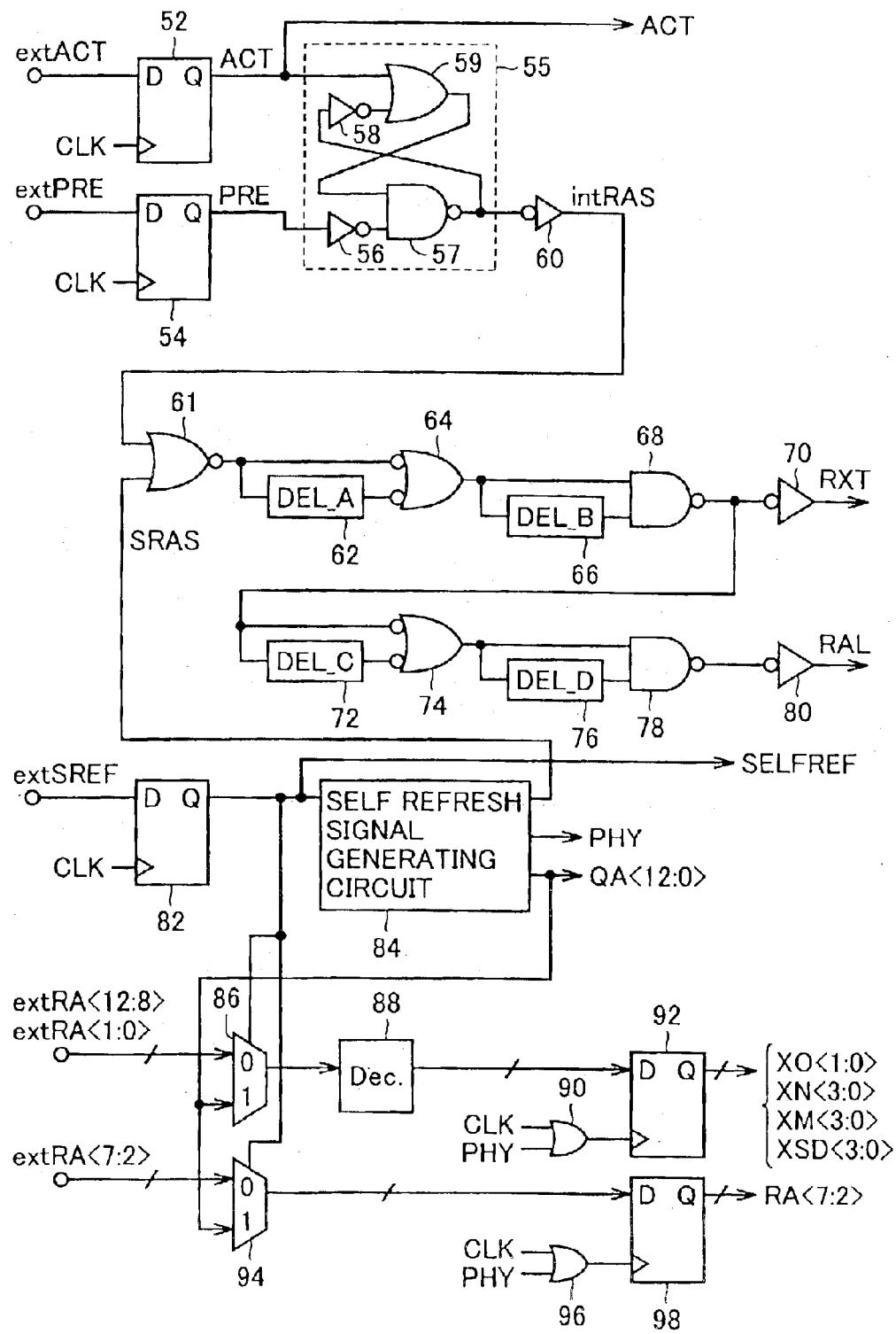
FIG. 3 is a circuit diagram showing the configuration of a central control circuit 17 in FIG. 1.

FIG. 3 is a circuit diagram showing the configuration of central control circuit 17 in FIG. 1.

Referring to FIG. 3, central control circuit 17 includes: a D flip-flop circuit 52 for latching control signal extACT synchronously with the rising edge of clock signal CLK and outputting signal ACT; a flip-flop circuit 54 for latching control signal extPRE synchronously with the rising edge of clock signal CLK and outputting a signal PRE; a latch circuit 55 for receiving signals ACT and PRE; and an inverter 60 for receiving and inverting an output of latch circuit 55 and outputting a signal intRAS.

Latch circuit 55 includes an inverter 56 receiving and inverting signal PRE, an NAND circuit 57 receiving an output of inverter 56 by its one of inputs, an inverter 58 receiving and inverting an output of NAND circuit 57, and an OR circuit 59 receiving an output of inverter 58 and signal ACT. An output of OR circuit 59 is supplied to the other input of NAND circuit 57. An output of NAND circuit 57 is also given to the input of inverter 60.

Central control circuit 17 further includes: a D flip-flop circuit 82 for latching control signal extSREF synchronously with the rising edge of clock signal CLK and outputting signal SELFREF; and a self refresh signal generating circuit 84 for outputting a signal SRAS as a row address strobe signal at the time of self refresh in response to activation of signal SELFREF, generating address signals QA<12:0> at the time of refresh, and outputting a clock signal PHY.

Central control circuit 17 further includes: an NOR circuit 61 receiving signals intRAS and SRAS; a delay circuit 62 for receiving and delaying an output of NOR circuit 61; an NAND circuit 64 receiving an output of delay circuit 62 and an output of NOR circuit 61; a delay circuit 66 for delaying an output of NAND circuit 64; an NAND circuit 68 receiving an output of delay circuit 66 and an output of NAND circuit 64; and an inverter 70 for receiving and inverting an output of NAND circuit. 68 and outputting signal RXT. Signal RXT is a trigger signal indicative of a timing of activating a word line.

Central control circuit 17 further includes: a delay circuit 72 receiving and delaying an output of NAND circuit 68; an NAND circuit 74 receiving an output of delay circuit 72 and an output of NAND circuit 68; a delay circuit 76 receiving and delaying an output of NAND circuit 74; an NAND circuit 78 receiving an output of NAND circuit 74 and an output of delay circuit 76; and an inverter 80 receiving and inverting an output of NAND circuit 78 and outputting a signal RAL. Signal RAL is a signal for giving a timing of latching a row address to local control circuits 18.1, 18.2, . . . in FIG. 1.

Central control circuit 17 further includes: a selector 86 receiving row address signals extRA<12:88> and extRA<1:0> supplied from the outside and bits corresponding to address QA<12:8> and QA<1:0> at the time of refresh, when signal SELFREF is at the H level, outputting a refresh address and, when signal SELFREF is at the L level, outputting an external row address; and a selector 94 receiving bits corresponding to external row address signals extRA<7:2> and address QA<7:2> for refresh, outputting the address for self refresh when signal SELFREF is at the H level, and outputting a row address signal supplied from the outside when signal SELFREF is at the L level.

Central control circuit 17 further includes: a decoding circuit 88 for decoding an output of selector 86; an OR circuit 90 receiving dock signals CLK and PHY; a D flip-flop circuit 92 latching an output of decoding circuit 88 synchronously with the rising edge of an output of OR circuit 90 and outputting decoded address signals XO<1:0>, XN<3:0>, XM<3:0> and XSD<3:0>; an OR circuit 96 receiving dock signals CLK and PHY; and a D flip-flop circuit 98 latching an output of selector 94 synchronously with the rising edge of an output of OR circuit 96 and outputting signals RA<7:2>.

Figure 4:
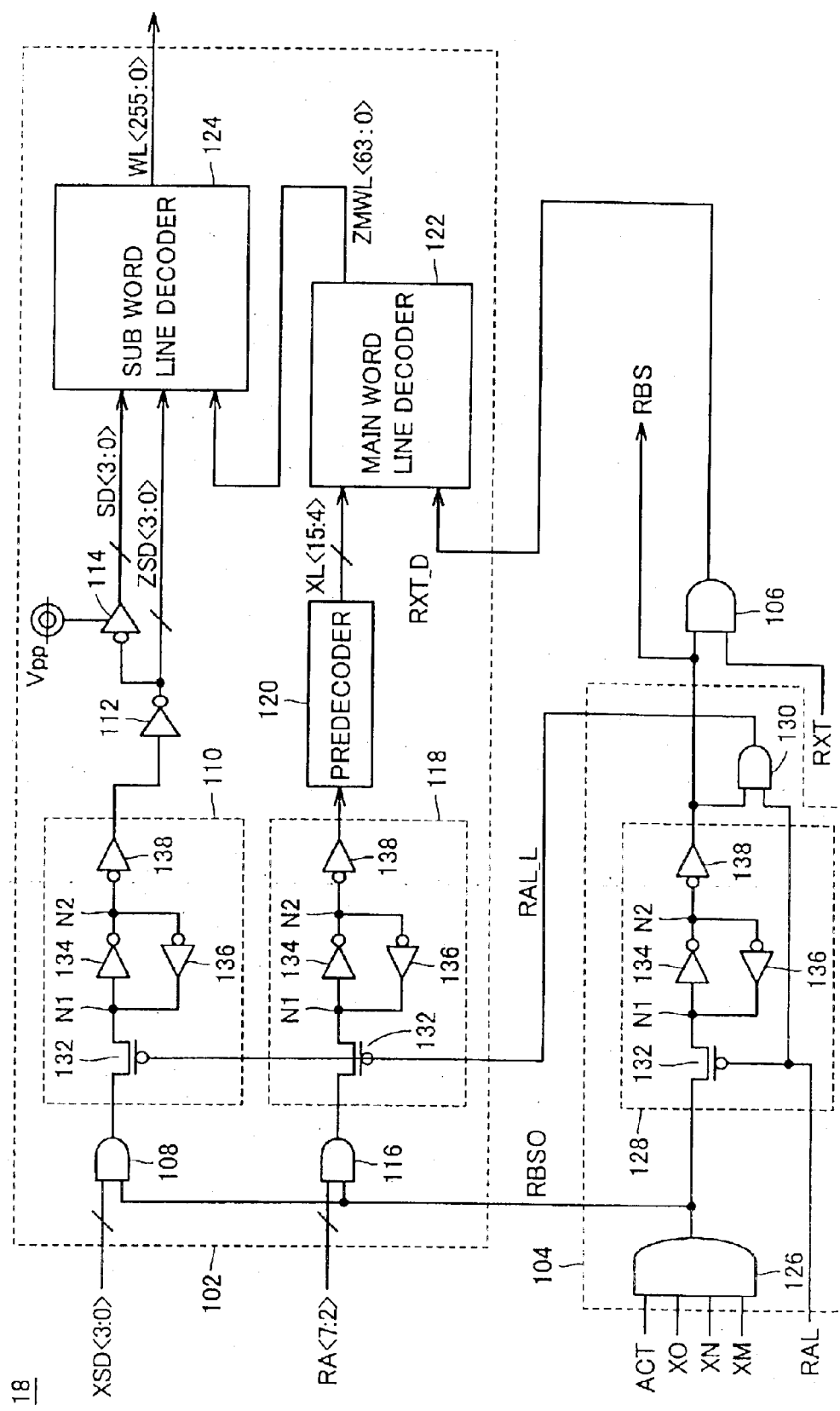
FIG. 4 is a circuit diagram of a local control circuit 18.

FIG. 4 is a circuit diagram of local control circuit 18. Local control circuit 18 representatively shows the configuration of each of local control circuits 18.1, 18.2, and 18.3 in FIG. 1.

Referring to FIG. 4, local control circuit 18 includes: an RBS output circuit 104 outputting block selection signal RBS in accordance with signals ACT, XO, XN, XM and RAL; an AND circuit 106 receiving signal RBS and trigger signal RXT and outputting a signal RXT_D; and a decoding circuit 102 for decoding address signals XSD<3:0> and RA<7:2> in accordance with signals RBSO, RAL_L, and RXT_D output from the RBS output circuit.

RBS output circuit 104 includes: an AND circuit 126 for receiving signals ACT, XO, XN, and XM and: outputting signal RBSO; a latch circuit 128 for latching and holding signal RBSO in accordance with signal RAL,; and an AND circuit 130 receiving block selection signal RBS and signal RAL outputted from latch circuit 128 and outputting signal RAL_L. Signals XO, XN, and XM are signals corresponding to blocks controlled by local control circuit 18 among decoded address signals.

Latch circuit 128 includes: a P-channel MOS transistor 132 connected between an output of AND circuit 126 and a node N1 and whose gate receives signal RAL; an inverter 134 whose input is connected to node N1 and whose output is connected to a node N2; an inverter 136 whose input is connected to node N2 and whose output is connected to node N1, and an inverter 138 whose input is connected to node N2, and which outputs block selection signal RBS.

Decoding circuit 102 includes: an AND circuit 108 receiving signals RBSO and XSD<3:0>; a latch circuit 110 for latching an output of AND circuit 108 in accordance with signal RAL_L; an inverter 112 receiving and inverting an output of latch circuit 110 and outputting signals ZSD<3:0>; and an inverter 114 receiving and inverting an output of inverter 112 and outputting signals SD<3:0>. Inverter 114 receives a boosted power supply potential Vpp as an operation power supply potential, and the H level of signal SD<3:0> is boosted to power supply potential Vpp.

Four series of AND circuit 108, latch circuit 110, and inverters 112 and 114 are provided in parallel so as to sequentially transmit signals of four bits. The configuration of latch circuit 110 is similar to that of latch circuit 128, so that its description will not be repeated.

Decoding circuit 102 further includes: an AND circuit 116 receiving signals RBSO and RA<7:2>; a latch circuit 118 latching an output of AND circuit 116 in accordance with signal RAL_L; a predecoder 120 for predecoding an output of latch circuit 118 and outputting signals XL<15:4>; a main word line decoder 122 for decoding signals XL<15:4> in accordance with signal RXT_D and selecting main word lines ZMWL<63:0>; and a sub word line decoder 124 for selecting word lines WL<255:0> in accordance with main word line ZMWL<63:0> and signals SD<3:0> and ZSD<3:0>.

Six series of AND circuits 116 and latch circuits 118 are provided in parallel in accordance with bits of signals RA<7:2>. Since the configuration of latch circuit 118 is similar to that of latch circuit 128, its description will not be repeated.

Figure 5:
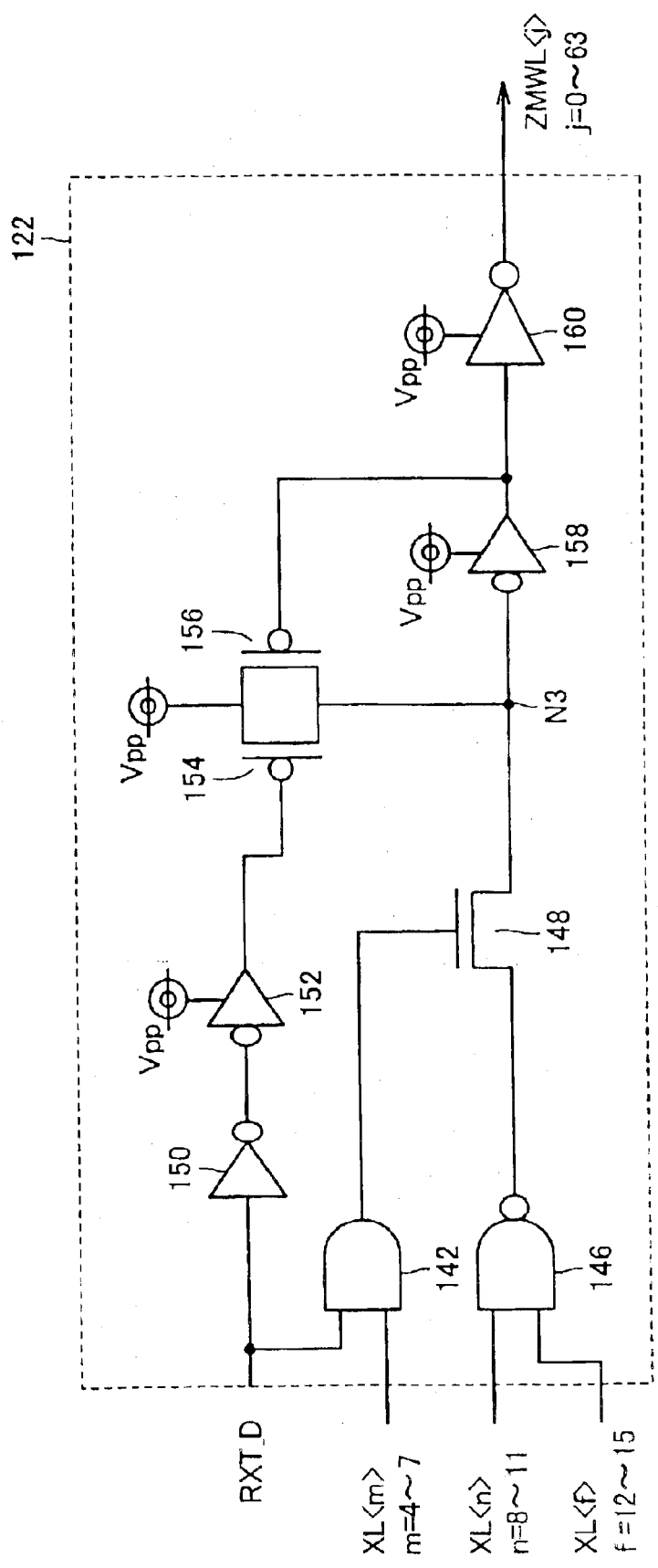
FIG. 5 is a circuit diagram showing the configuration of a main word line decoder 122 in FIG. 4.

FIG. 5 is a circuit diagram showing the configuration of main word line decoder 122 in FIG. 4.

Referring to FIG. 5, main word line decoder 122 is a circuit of 64 series for selecting 64 main word lines by decoding. FIG. 5 shows one of the 64 series.

Main word line decoder 122 includes an AND circuit 142 receiving signals RST_D and XL<m>, an NAND circuit 146 receiving signals XL<n> and XL<f>, and an N-channel MOS transistor 148 connected between an output of NAND circuit 146 and node N3 and whose gate receives an output of AND circuit 142.

Signal XL<m> is any of signals XL<4> to XL<7> outputted from predecoder 120 of FIG. 4. Signals XL<n> is any of signals XL<8> to XL<11>. Signal XL<f> is any of signals XL<12> to XL<15>. By NAND circuit 146, AND circuit 142, and N-channel MOS transistor 148, one of 64 combinations of 4×4×4 is selected.

Main word line decoder 122 further includes an inverter 150 receiving and inverting signal RXT_D, an inverter 152 receiving and inverting an output of inverter 150, and a P-channel MOS transistor 154 connected between node N3 and a node to which power supply potential Vpp is applied and whose gate receives an output of inverter 152. According to signal RXT_D, transistor 154 is made conductive, and node N3 is precharged.

Main word line decoder 122 further includes an inverter 158 whose input is connected to node N3, a P-channel MOS transistor 156 connected between the node to which power supply potential Vpp is applied and node N3 and whose gate receives an output of inverter 158, and an inverter 160 receiving and inverting an output of inverter 158 and driving main word line ZMWL<j>. Main word line ZMWL<j> is one of main word lines ZMWL<63:0> in FIG. 4.

When selected in accordance with signals XL<m>, XL<n>, and XL<f>, an L level signal is transmitted from NAND circuit 146 via transistor 148. When not selected, node N3 is precharged and the H level of node N3 is held by transistor 156.

To drive the word line finally to a high potential, boosted power supply potential Vpp is applied as a power supply potential of inverters 152, 158 and 160.

Figure 6:
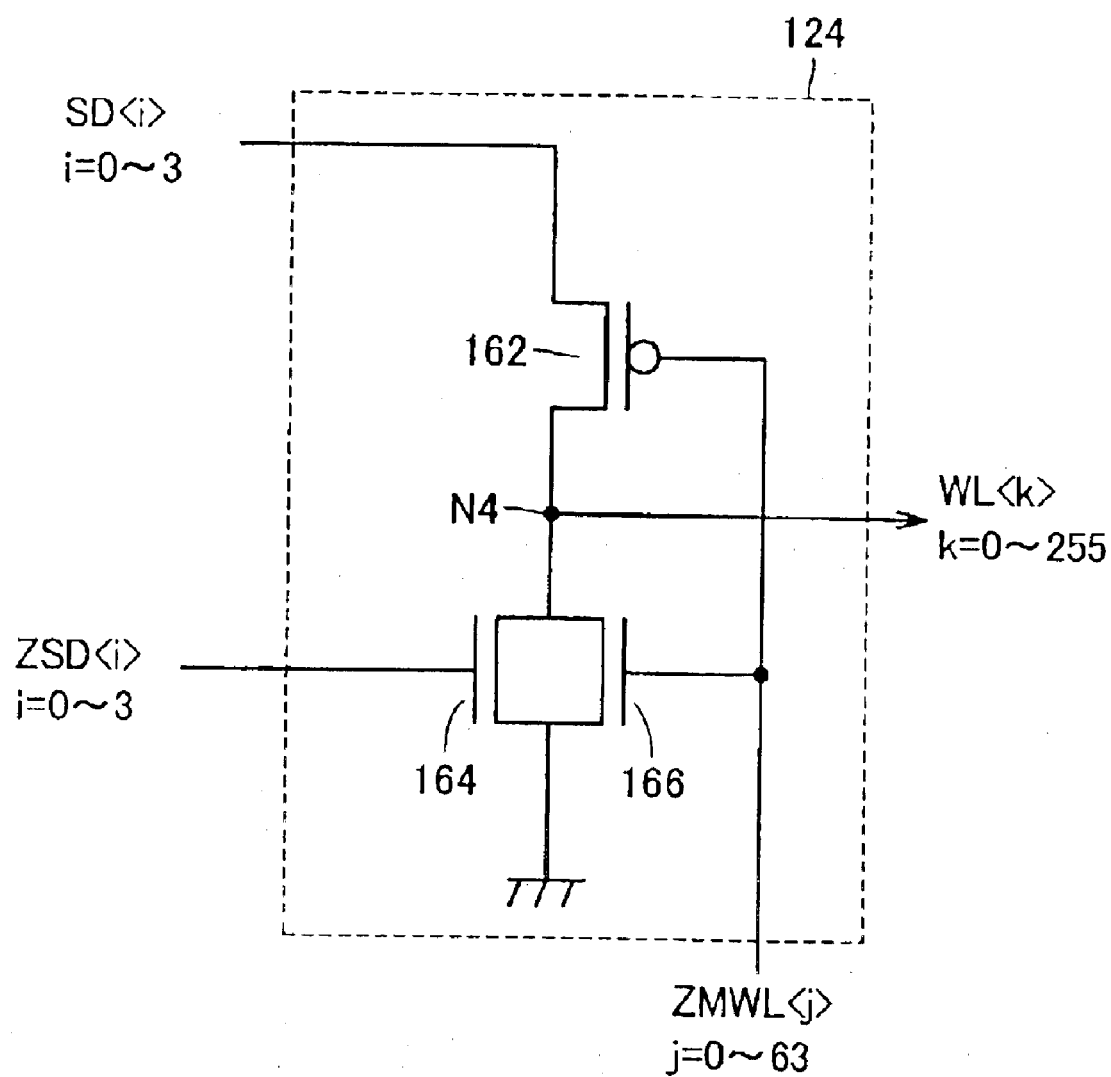
FIG. 6 is a circuit diagram showing the configuration of a sub word line decoder 124 in FIG. 4.

FIG. 6 is a circuit diagram showing the configuration of sub word line decoder 124 in FIG. 4.

Referring to FIG. 6, sub word line decoder 124 is a circuit of 256 series for driving 256 word lines, and one series is shown as a representative. Sub word line decoder 124 includes an N-channel MOS transistor 164 connected between a node N4 and the ground node and whose gate receives signal ZSD<i>, an N-channel MOS transistor 166 connected between node N4 and the ground node and whose gate is connected to main word line ZMWL<j>; and a P-channel MOS transistor 162 connected between the node to which signal SD<i> is applied and node N4 and having a gate to which main word line ZMWL<j> is connected.

Node N4 is connected to word line WL<k>. Signal SD<i> is one bit of signals SD<3:0> in FIG. 4, and signal ZDS<i> is an inversion signal of signal SD<3:0>. Word line WL<k> is one of word lines WL<255:0> in FIG. 4. By the sub word line decoder, one of 256 combinations of 64×4 is selected.

Figure 7:
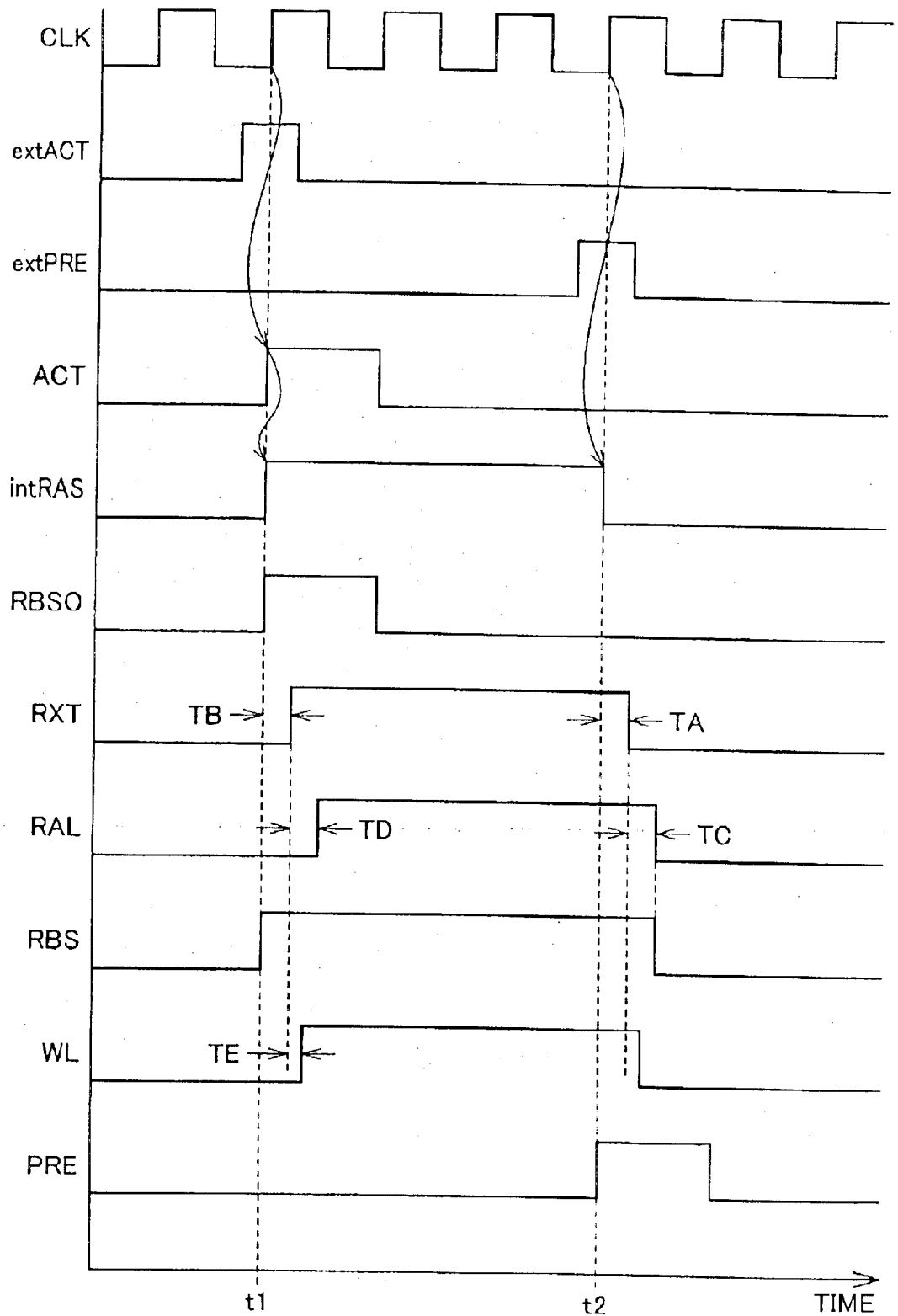
FIG. 7 is an operational waveform chart for describing the outline of a general operation of a semiconductor memory device 1.

FIG. 7 is an operational waveform chart for describing the outline of general operation of semiconductor memory device 1.

Referring to FIG. 7, at time t1, command extACT for instructing activation of a row is latched at the rising edge of clock signal CLK, and signal ACT is made active. In response to the activation of signal ACT, the value held in latch circuit 55 in FIG. 3 changes and, accordingly, signal X intRAS changes to the H level.

In a portion selected by row addresses RA<12:8> in local control circuit 18, corresponding block selection generation signal RBSO and block selection signal RBS are activated to the H level.

On the other hand, after a period TB specified by delay circuit 66 in FIG. 3 since signal intRAS has changed to the H level, signal RXT is activated from the L level to the H level. By the activation of signal RXT to the H level, after a period TE, word line WL is activated to the H level.

After period TD specified by delay circuit 76, row address latch signal RAL is activated to the H level, and latch circuits 110, 118 and 128 in FIG. 4 latch input data. Even when signal RBSO is made inactive to the L level after that, word line WL and block selection signal RBS hold the active state of the H level.

At time t2, command extPRE instructing precharging of a row of memory cells is latched at the rising edge of the clock signal, and signal PRE is activated to the H level. In response to the activation of signal PRE, latch circuit 55 in FIG. 3 is reset, and signal intRAS changes to the L level.

After a period TA specified by delay circuit 62 in FIG. 3, signal RXT also changes from the H level to the L level. In local control circuit 18 selected by signals RA<12:8>, in response to the change to the L level of signal RXT, a main word line selected from main word lines ZMWL<63:0> is reset from the L-level to the H level. In response to this, word line WL is made inactive to the L level.

Subsequently, after a period TC specified by delay circuit 72, row address latch signal RAL changes to the L level, and block selection signal RBS also changes to the L level.

First Embodiment

Figure 8:
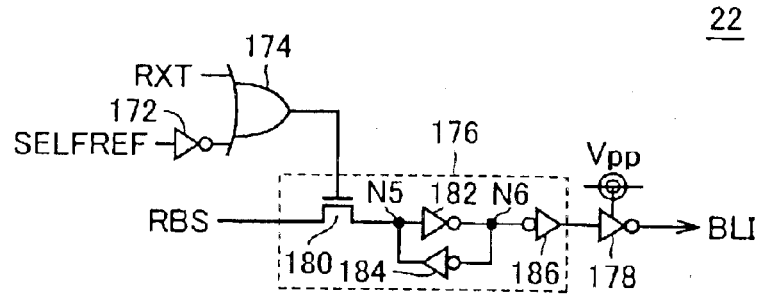
FIG. 8 is a circuit diagram showing the configuration of a BLI control circuit 22 used in a first embodiment.

FIG. 8 is a circuit diagram showing the configuration of BLI control circuit 22 used in a first embodiment. BLI control circuit 22 is a circuit used as holding circuit 22U or 22D in FIG. 1, which controls isolation/connection from/to the sense amplifier shared by bit lines of two blocks.

Referring to FIG. 8, BLI control circuit 22 includes an inverter 172 receiving and inverting signal SELFREF, an OR circuit 174 receiving an output of inverter 172 and signal RXT, a latch circuit 176 latching block selection signal RBS in accordance with an output of OR circuit 174, and an inverter 178 receiving and inverting an output of latch circuit 176 and outputting bit line isolation signal BLI. Inverter 178 receives boosted power supply potential Vpp as an operation power supply potential. Inverter 172 and OR circuit 174 may be disposed in local control circuits 18.1 to 18.3 and central control circuit 17 in FIG. 1. In this case, an output signal of OR circuit 174 is received by BLI control circuit 22.

Latch circuit 176 includes: an N-channel MOS transistor 180 connected between a node to which block selection signal RBS is supplied and a node N5 and whose gate receives an output of OR circuit 174; an inverter 182 whose input is connected to node N5 and whose output is connected to a node N6; an inverter 184 receiving and inverting an output of inverter 182 and feeding back the resultant to node N5; and an inverter 186 whose input is connected to node N6. An output of inverter 186 is supplied to the input of inverter 178.

Latch circuit 176 latches block selection signal RBS when an output of OR circuit 174 is at the H level. On the other hand, latch circuit 176 holds the value of the latched block selection signal when an output of OR circuit 174 is at the L level.

Figure 9:
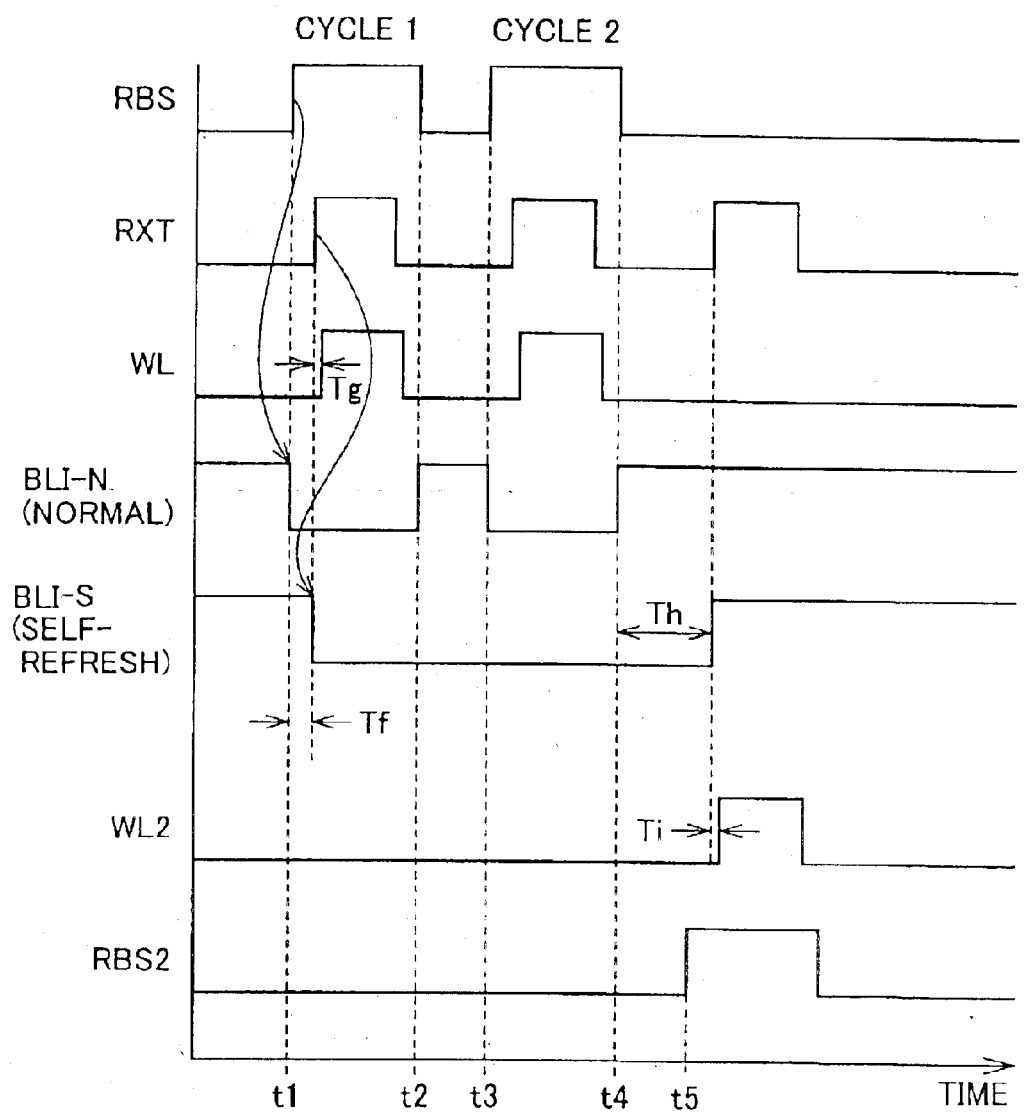
FIG. 9 is an operational waveform chart for describing the operation of the first embodiment.

FIG. 9 is an operational waveform chart for describing the operation of the first embodiment.

Referring to FIGS. 8 and 9, word line WL is a word line selected by a row address in a specific block. Signal BLI-N is a bit line isolation signal in a normal mode, that is, when signal SELFREF is at the L level. Signal BLI-S indicates a bit line isolation signal in a self refresh mode, that is, when signal SELFREF is at the H level.

Word line WL2 is a word line in a memory block adjacent to the memory block selected in the period from time t1 to time t4. The adjacent memory block is selected at or after time t5. Signal RBS2 is a selection signal for selecting the adjacent memory block.

In the period from time t1 to time t2, block selection signal RBS is activated to the H level and the operation of a first cycle is performed. In a normal mode, at time t1, bit line isolation signal BLI-N changes from the H level to the L level. At time t2, bit line isolation signal BLI-N changes again from the L level to the H level. During the period from time t1 to time t2, in response to trigger signal RXT, word line WL is made active and inactive. During the period from time t2 to time t3, bit line isolation signal BLI-N is once reset to the H level of the initial state.

Subsequently, in a second cycle from time t3 to time t4, when block selection signal RBS is activated to the H level, in a manner similar to the first cycle, bit line isolation signal BLI-N changes to activate a word line.

On the other hand, in the self refresh mode, even when RBS is activated at time t1, bit line isolation signal BLI-S does not change. After a period Tf from time t1, trigger signal RXT is activated and, accordingly, latch circuit 176 in FIG. 8 latches block selection signal RBS. As a result, bit line isolation signal BLI-S falls from the H level to L level.

Different from the normal time, in the period from time t2 to time t3, bit line isolation signal BLI-S is held in the L-level state. Even if the refresh cycle is finished by time t4, bit line isolation signal BLI-S does not immediately return to the H level.

At time t5, block selection signal RBS2 in the neighboring block is activated, and trigger signal RXT is made active. Accordingly, block selection signal RBS at the L level is latched, and bit line isolation signal BLI-S changes from the L level to the H level.

As described above, in the self refresh mode, while the same block is accessed, bit line isolation signal BLI-S does not change. Therefore, the charge/discharge current of bit line isolation signal BLI can be reduced in the self refresh mode.

In the self refresh mode, a timing margin Tg from the falling edge of bit line isolation signal BLI-S to the rising edge of the word line is narrowed as compared with a margin in the normal mode only by a period Tf. A timing margin Ti from the rising edge of bit line isolation signal BLI-S to the rising edge of word line WL2 of the adjacent memory block in the self refresh mode is also narrowed as compared with a timing margin in the normal mode only by a period Th. There is consequently a case that such a phenomenon causes a problem in a high-speed operation. However, a high speed operation is not so demanded in the self refresh mode as compared with the normal operation mode, so that a problem does not arise in many cases.

In the semiconductor memory device according to the first embodiment, during the period in which the same block is accessed, the number of charging and discharging times can be reduced without using an output of a refresh counter. Therefore, even when the array configuration such as the number of word lines constructing a memory block and the number of memory blocks is changed, it is unnecessary to change the refresh control circuit.

Second Embodiment

Figure 10:
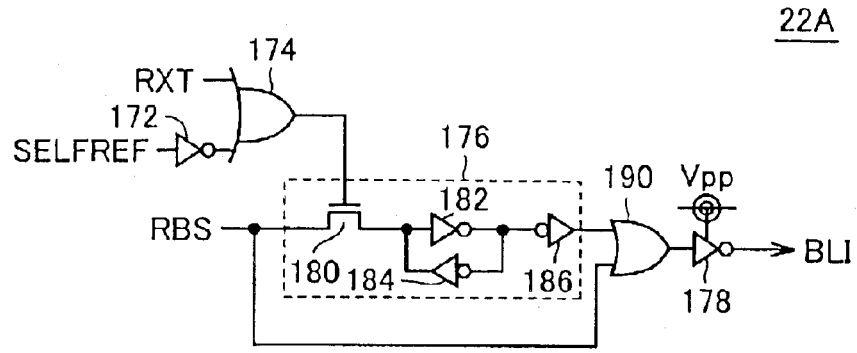
FIG. 10 is a circuit diagram showing the configuration of a BLI control circuit 22A used in a second embodiment.

FIG. 10 is a circuit diagram showing the configuration of a BLI control circuit 22A used in a second embodiment.

Referring to FIG. 10, BLI control circuit 22A further includes, in addition to the configuration of BLI control circuit 22 shown in FIG. 8, an OR circuit 190 between inverters 186 and 178. OR circuit 190 receives an output of inverter 186 and block selection signal RBS. An output of OR circuit 190 is supplied to inverter 178.

Since the other configuration is similar to that of BLI control circuit 22 described in FIG. 8, its description will not be repeated.

By the addition of OR circuit 190, when block selection signal RBS is at the H level, bit line isolation signal BLI always becomes L level.

Figure 11:
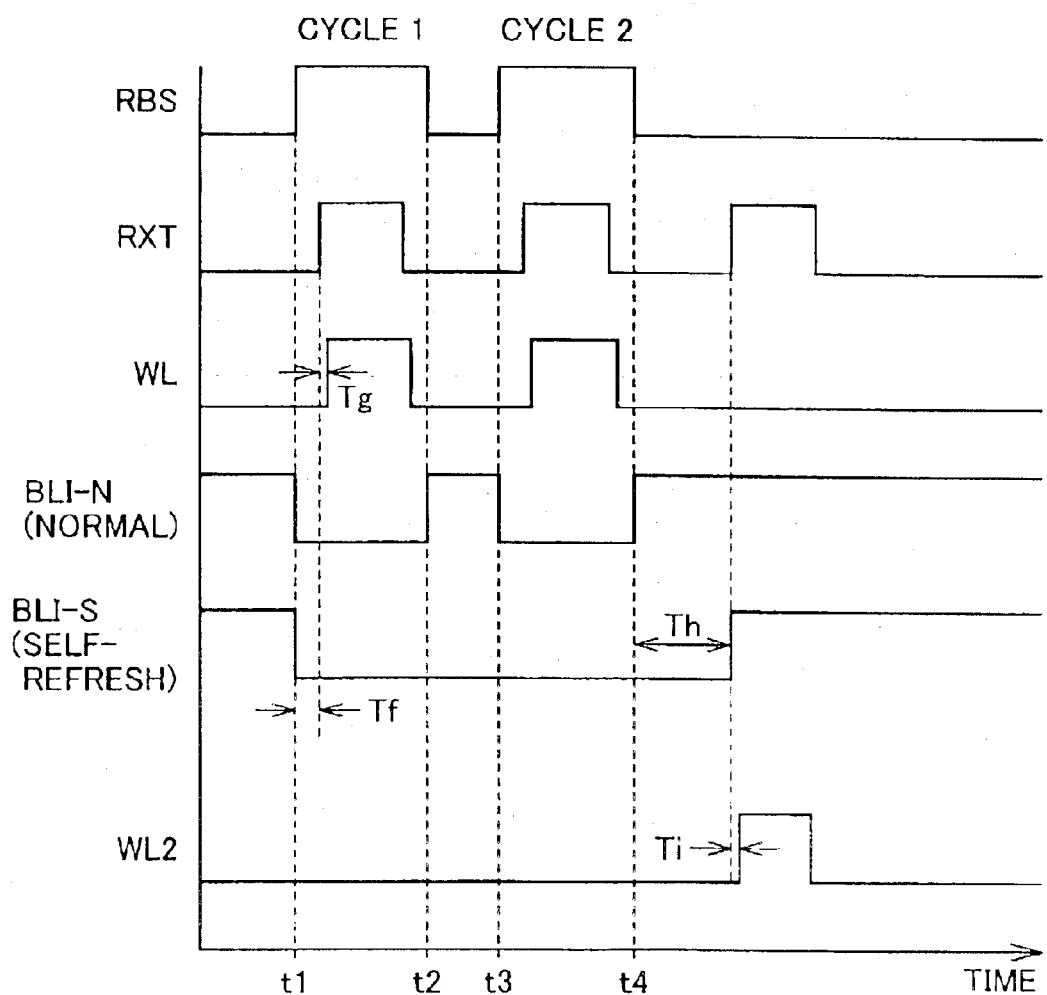
FIG. 11 is an operational waveform chart for describing the operation of BLI control circuit 22A shown in FIG. 10.

FIG. 11 is an operational waveform chart for describing the operation of BLI control circuit 22A shown in FIG. 10.

Referring to FIG. 11, an unnecessary swing does not generate in bit line isolation signal BLI-S between time t2 and t3 in a manner similar to the case of the first embodiment. It can reduce the charge/discharge current caused by the bit line isolation signal.

Moreover, due to addition of OR circuit 190, the falling timing of signal BLI-S changes to time t1. This point is different from the first embodiment.

Specifically, the falling edge of the bit line isolation signal in the self refresh mode is at the same timing as that in the normal operation mode. As a result, the timing margin in the self refresh mode can be further improved as compared with the first embodiment. The point such that since the charge/discharge current due to the bit line isolation signal can be reduced without using a refresh counter, the configuration of the memory array is easily changed in a manner similar to the first embodiment.

Third Embodiment

In a third embodiment, in place of local control circuit 18 described in FIG. 4, a local control circuit 18B is used.

Figure 12:
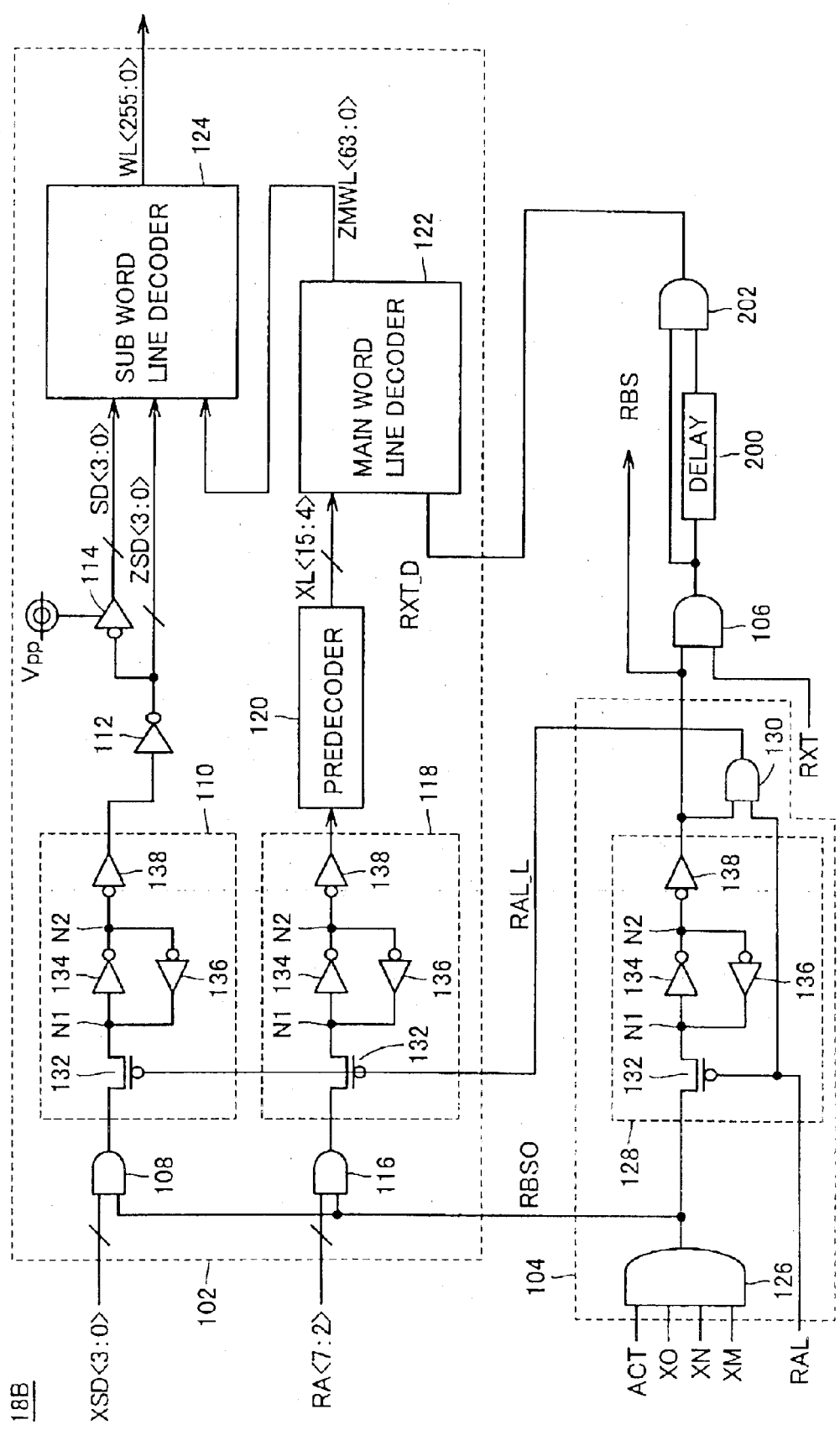
FIG. 12 is a circuit diagram showing the configuration of a local control circuit 18B.

FIG. 12 is a circuit diagram showing the configuration of local control circuit 18B.

Referring to FIG. 12, local control circuit 18B includes, in addition to the configuration of local control circuit 18 shown in FIG. 4, a delay circuit 200 receiving and delaying an output of AND circuit 106, and an AND circuit 202 receiving an output of delay circuit 200 and an output of AND circuit 106 and outputting signal RXT_D. Since the configuration of the other portion is similar to that in local control circuit 18 described by referring to FIG. 4, its description will not be repeated.

Figure 13:
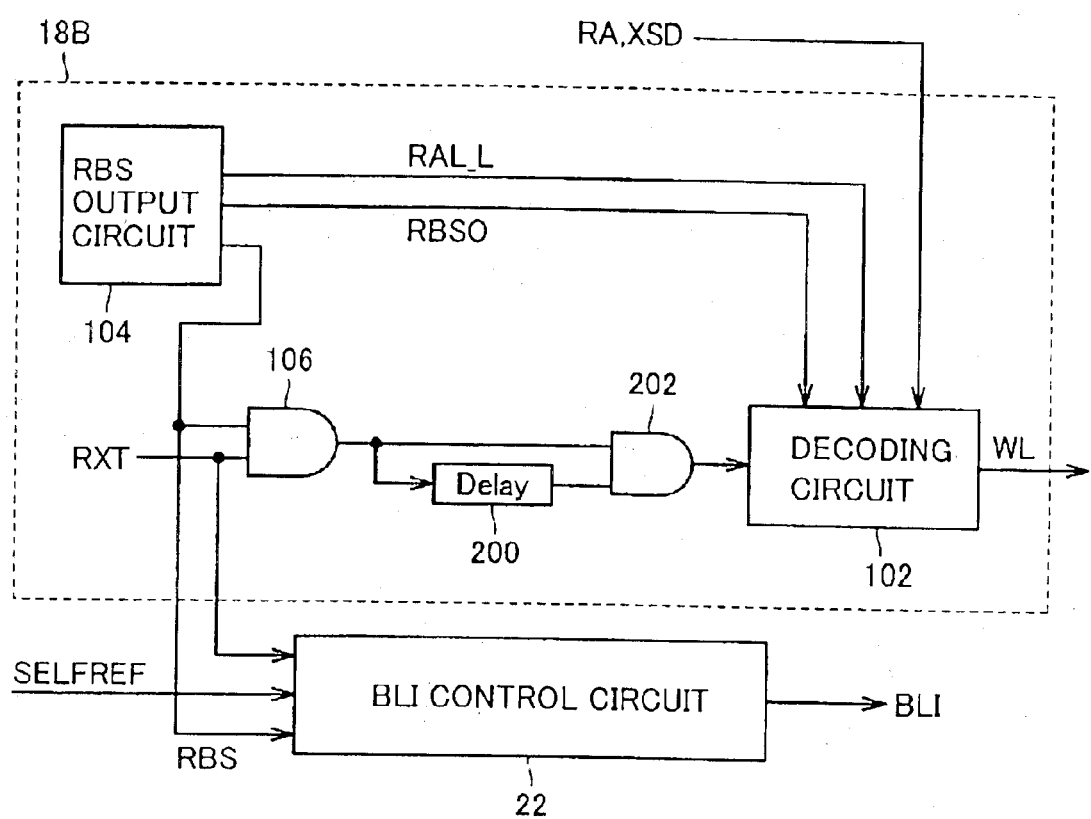
FIG. 13 is a circuit diagram for describing connection between local control circuit 18B and BLI control circuit 22 in a third embodiment.

FIG. 13 is a circuit diagram for describing connection between local control circuit 18B and BLI control circuit 22 in the third embodiment.

In the third embodiment, a combination of BLI control circuit 22 and local control circuit 18B is used. As the configuration of BLI control circuit 22 has been described by referring to FIG. 8, the description will not be repeated here. Though the internal circuits of RBS output circuit 104 and decoding circuit 102 in local control circuit 18B are not shown in FIG. 13, the internal configurations are shown in FIG. 12. So their description will not be repeated here.

Figure 14:
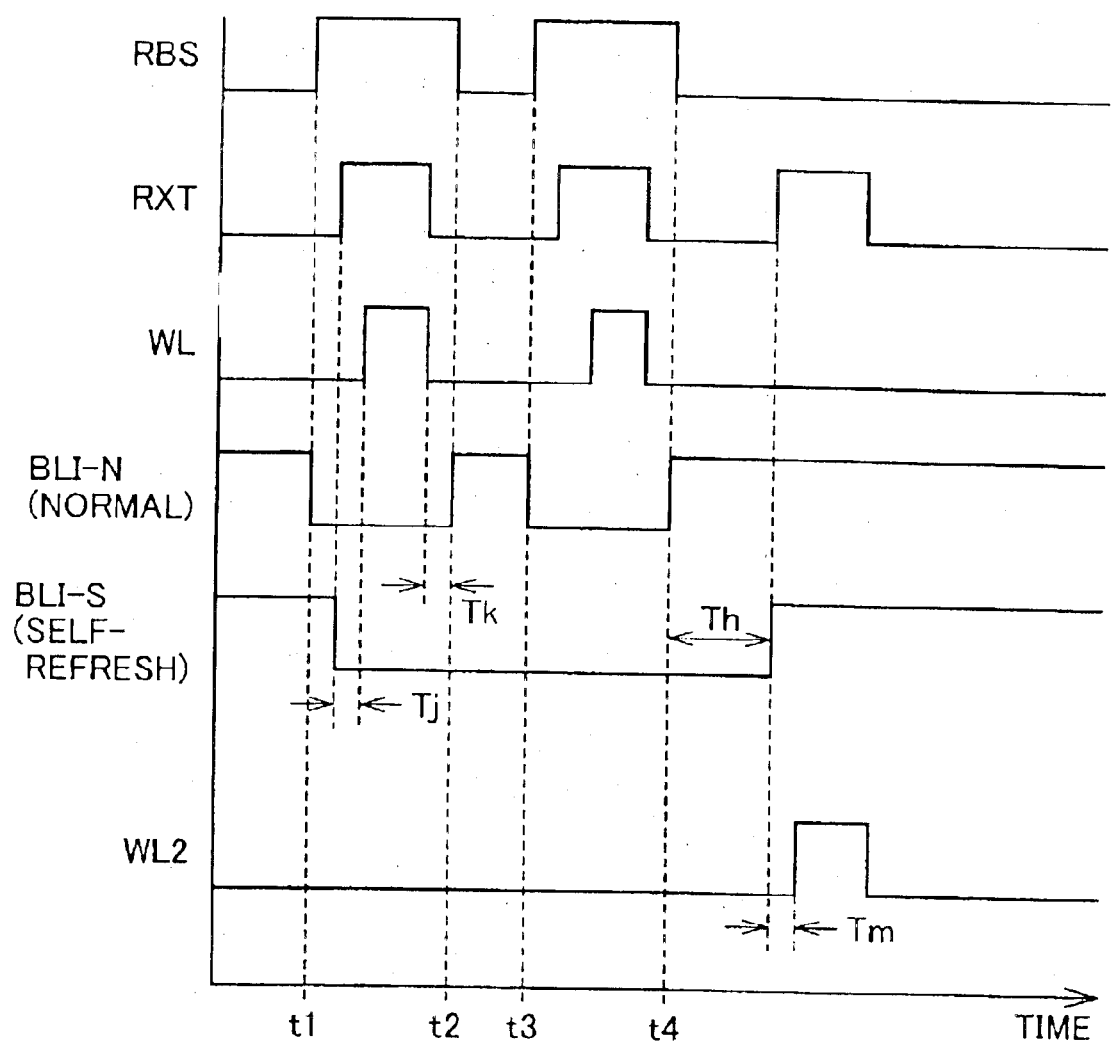
FIG. 14 is an operational waveform chart for describing the operation of a semiconductor memory device of the third embodiment.

FIG. 14 is an operational waveform chart for describing operations of the semiconductor memory device of the third embodiment.

Referring to FIG. 14, in a manner similar to the first embodiment, unnecessary charging/discharging arises at the time of a self refresh in the period from time t2 to time t3. In addition, the word line is driven at a timing obtained via delay circuit 200. Consequently, a margin Tj can be assured between the falling edge of signal BLI-S and the rising edge of word line WL. Thus, the timing-margin at the time of self refresh can be further improved.

Even if the rising edge of signal RXT is moved relative to the rising edge of block selection signal RBS, timing margin Tj can be always held constant. In the circuit configuration, the falling edge of word line WL is not delayed from the falling edge of signal RXT. Consequently, the timing margin Tk between the falling edge of the word line and the rising edge of signal BLI-N is not narrowed.

Further, a timing margin Tm between the rising edge of word line WL2 of the adjacent block and the rising edge of signal BLI-S can be made wider than timing margin Ti in the first and second embodiments and is equalized to timing margin Tj. Effects produced by not using an output of a refresh counter are similar to those in the first embodiment.

Fourth Embodiment

Figure 15:
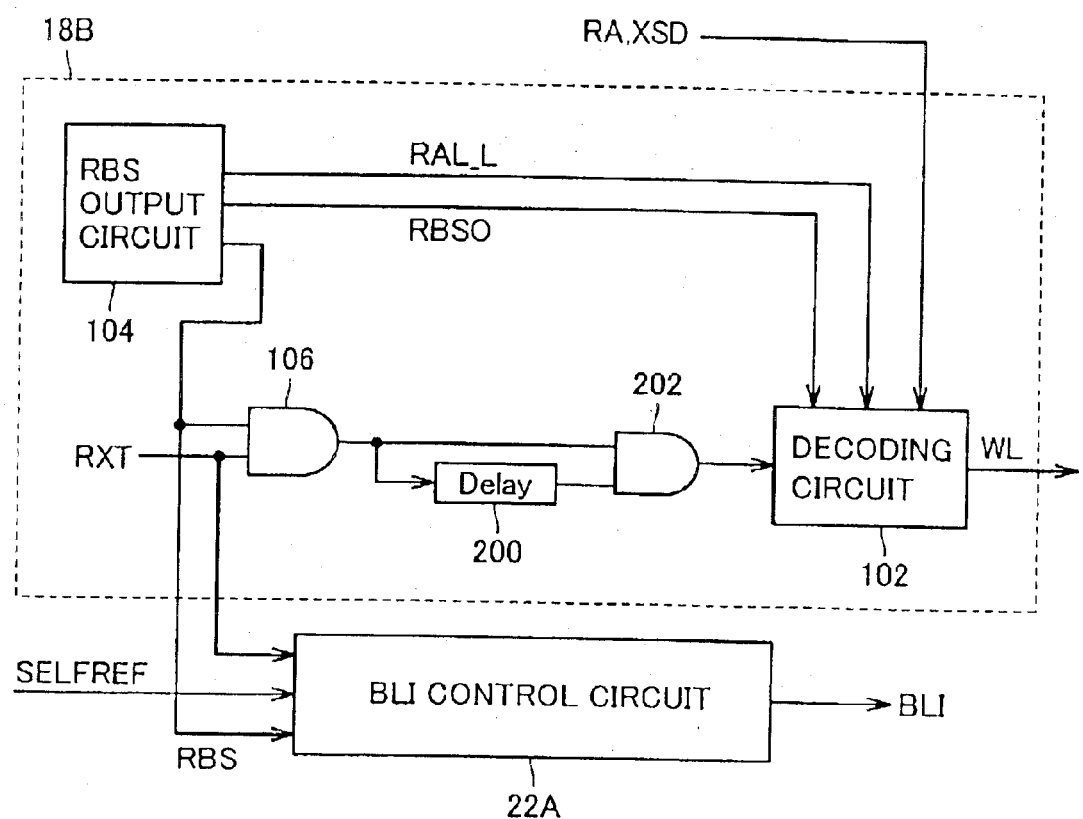
FIG. 15 is a circuit diagram for describing the local control circuit and the BLI control circuit in a semiconductor memory device of a fourth embodiment.

FIG. 15 is a circuit diagram for describing the local control circuit and the BLI control circuit in a semiconductor memory device of a fourth embodiment.

Referring to FIG. 15, in the fourth embodiment, BLI control circuit 22A is used. BLI control circuit 22 is replaced with BLI control circuit 22A in the configuration shown in FIG. 13. Since the configuration of BLI control circuit 22A has been described by referring to FIG. 10, its description will not be repeated.

Figure 16:
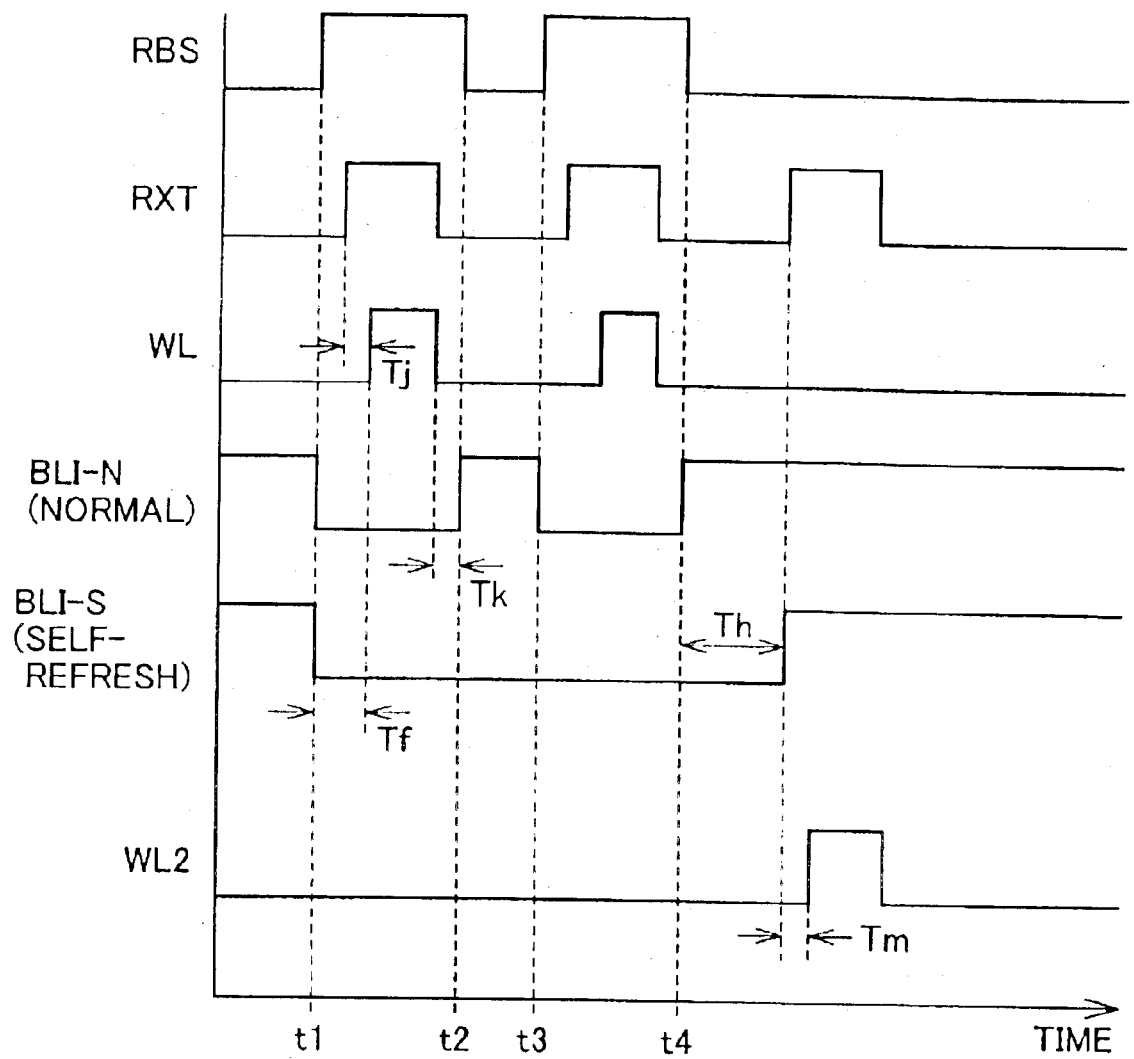
FIG. 16 is an operational waveform chart for describing the operation of the semiconductor memory device of the fourth embodiment.

FIG. 16 is an operational waveform chart for describing the operation of the semiconductor memory device of the fourth embodiment.

Referring to FIG. 16, at time t1, signal BLI-S changes from the H level to the L level in response to the rising edge of block selection signal RBS. Since the other portion is similar to that of FIG. 14, its description will not be repeated.

The forth embodiment produces, therefore, in addition to the effects of the third embodiment, an effect that timing margin Tf between the falling edge of signal BLI-S and the rising edge of the word line can be further widened.

Fifth Embodiment

Figure 17:
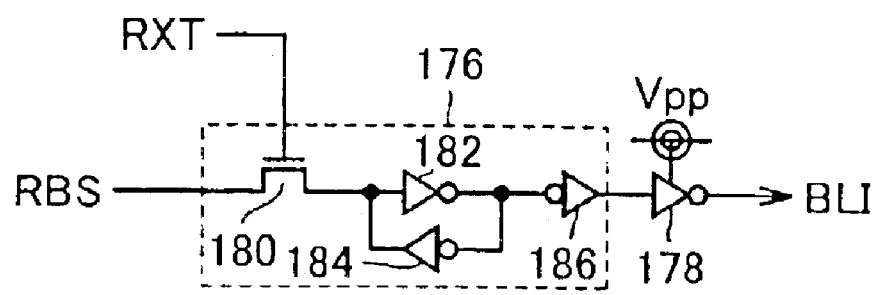
FIG. 17 is a circuit diagram showing the configuration of a BLI control circuit 22C used in a fifth embodiment.

FIG. 17 is a circuit diagram showing the configuration of a BLI control circuit 22C used in a fifth embodiment.

Referring to FIG. 17, the configuration of BLI control circuit 22C is different from that of BLI control circuit 22 shown in FIG. 8 with respect to the point that signal RXT is directly supplied to the gate of N-channel MOS transistor 180. The configuration of the other part is similar to that of BLI control circuit 22, so that its description will not be repeated.

In BLI control circuit 22C, without a discrimination between the self refresh mode and the normal mode, bit line isolation signal BLI is controlled only by block selection signal RBS and trigger signal RXT. Since the waveform chart is the same as that of FIG. 9 except that signal BLI-S in FIG. 9 is replaced with signal BLI and the waveform of signal BLI-N is removed, its description will not be repeated.

With the configuration as shown in FIG. 17, as long as the same memory block is continuously accessed, an unnecessary swing of bit line isolation signal BLI does not generate in both the self refresh mode and the normal mode.

The timing margin between the falling edge of signal BLI and the rising edge of word line WL is always the same as timing margin Tg in FIG. 9. Consequently, the timing margin in the normal operation of bit line isolation signal BLI and word lines WL and WL2 is narrowed in a manner similar to timing margins Tg and Ti in the self refresh mode in the first embodiment. However, it does not become a problem in some cases when timing margins Tg and Ti are sufficient for a demand for high-speed operation of a memory device.

The effect of the fifth embodiment is similar to the effect of the first embodiment. Namely, there is the effect that the array configuration can be easily changed since an output of the refresh counter is not used.

Sixth Embodiment

Figure 18:
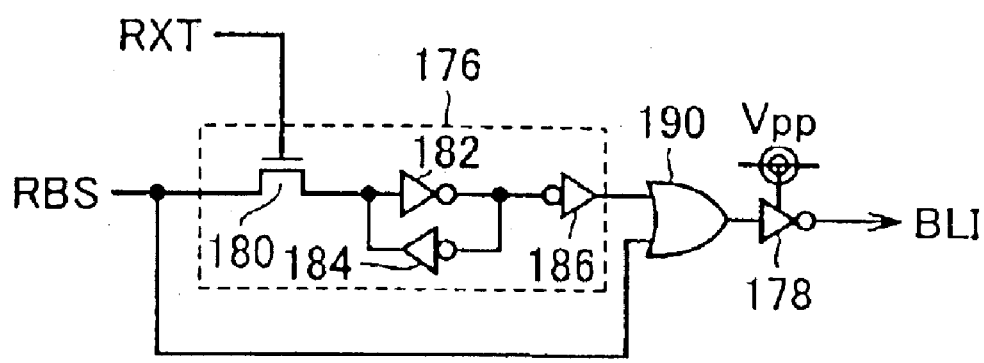
FIG. 18 is a circuit diagram showing the configuration of a BLI control circuit 22D used in a sixth embodiment.

FIG. 18 is a circuit diagram showing the configuration of a BLI control circuit 22D used in a sixth embodiment.

Referring to FIG. 18, the configuration of BLI control circuit 22D is similar to that of BLI control circuit 22A described in FIG. 10 except for a point that signal RXT is directly supplied to the gate of N-channel MOS transistor 180. Since the other part is similar to that of BLI control circuit 22A, its description will not be repeated.

Therefore, without a discrimination between the self refresh mode and the normal mode, bit line isolation signal BLI is controlled only by block selection signal RBS and trigger signal RXT. The waveform chart at this time is similar to that of FIG. 11 except that signal BLI-S is replaced with signal BLI and the waveform of signal BLI-N is eliminated. The description by using the waveform will not be therefore repeated.

With the configuration as shown in FIG. 18, as long as the same memory block is continuously accessed, in a manner similar to signal BLI-S described in FIG. 14, an unnecessary swing of bit line isolation signal BLI does not generate in both the self refresh mode and the normal mode. Since the falling tuning of signal BLI is the same as that of signal BLI-S in FIG. 11, the timing margin between the falling edge of bit line isolation signal BLI and the rising edge of word line WL is the same as timing margin Tf+ timing margin Tg in FIG. 11. Consequently, the timing margin is improved as compared with timing margin Tg in the fifth embodiment.

The timing margin between the rising edge of bit line isolation signal BLI and the falling edge of word line WL2 is the same as timing margin Ti in the fifth embodiment. However, it does not become a problem in some cases when timing margin Ti is sufficient for a demand for high-speed operation of the device. In a manner similar to the effect of the first embodiment, there is an effect that the array configuration can be easily changed since an output of a refresh counter is not used.

Seventh Embodiment

Figure 19:
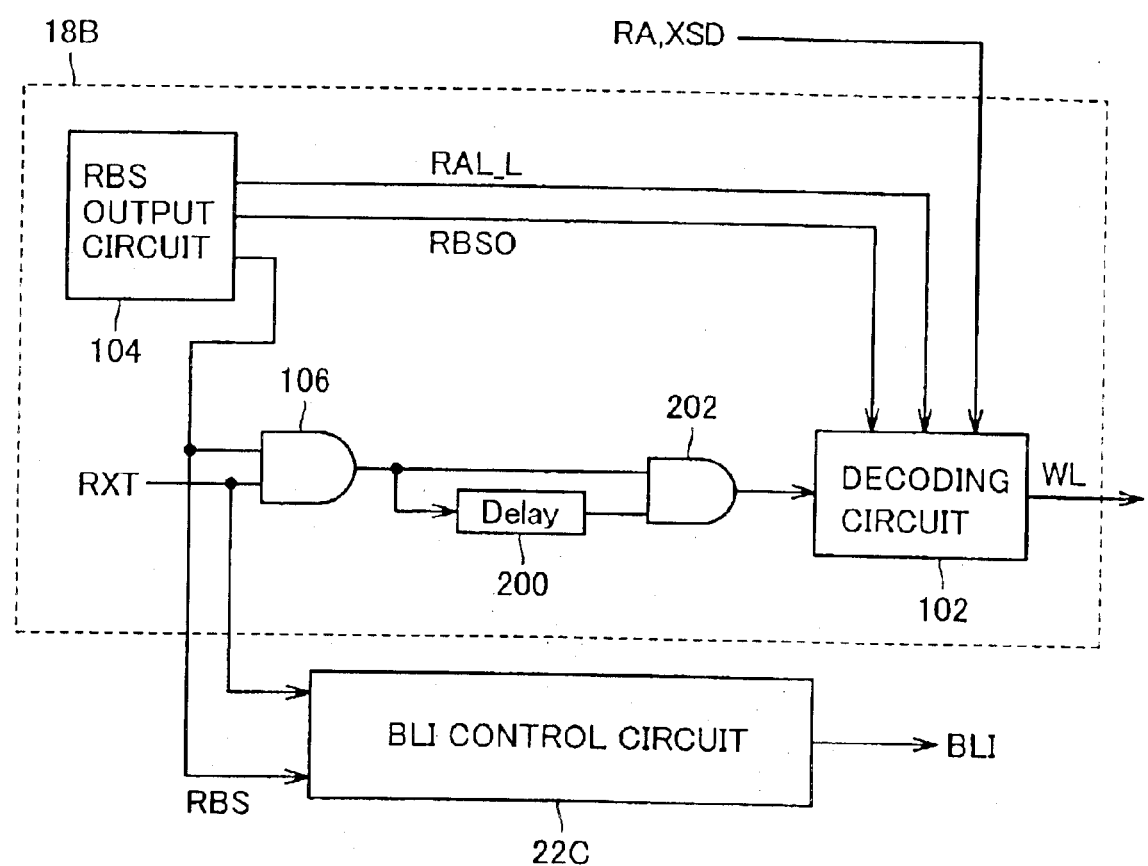
FIG. 19 is a diagram for describing connection between a local control circuit and a BLI control circuit in a seventh embodiment.

FIG. 19 is a diagram for describing connection between the local control circuit and the BLI control circuit in a seventh embodiment.

Referring to FIG. 19, in the seventh embodiment, in place of BLI control circuit 22 in FIG. 13, BLI control circuit 22C is used. Since local control circuit 18B has been already described, its description will not be repeated. Since BLI control circuit 22C has been described by referring to FIG. 17, its description will not be repeated.

With such a configuration, without a discrimination between the self refresh mode and the normal mode, bit line isolation signal BLI is controlled only by block selection signal RBS and trigger signal RXT. The waveform chart at this time is the same as that of FIG. 14 except that signal BLI-S is replaced with signal BLI and the waveform of signal BLI-N is eliminated. Therefore, description by using the waveform will not be repeated.

With the configuration as shown in FIG. 19, a control similar to that on signal BLI-S in FIG. 14 is performed. Specifically, without a discrimination between the self refresh mode and the normal mode, as long as the same memory block is continuously accessed, a swing of bit line isolation signal BLI does not generate.

The falling and rising timings of the bit line isolation signal are the same as those of signal BLI-S in FIG. 14. Therefore, in a manner similar to the fifth embodiment, timing margins Tj and Tm can be assured. Since an output of a refresh counter is not used, an effect similar to that of the first embodiment is produced.

Eighth Embodiment

Figure 20:
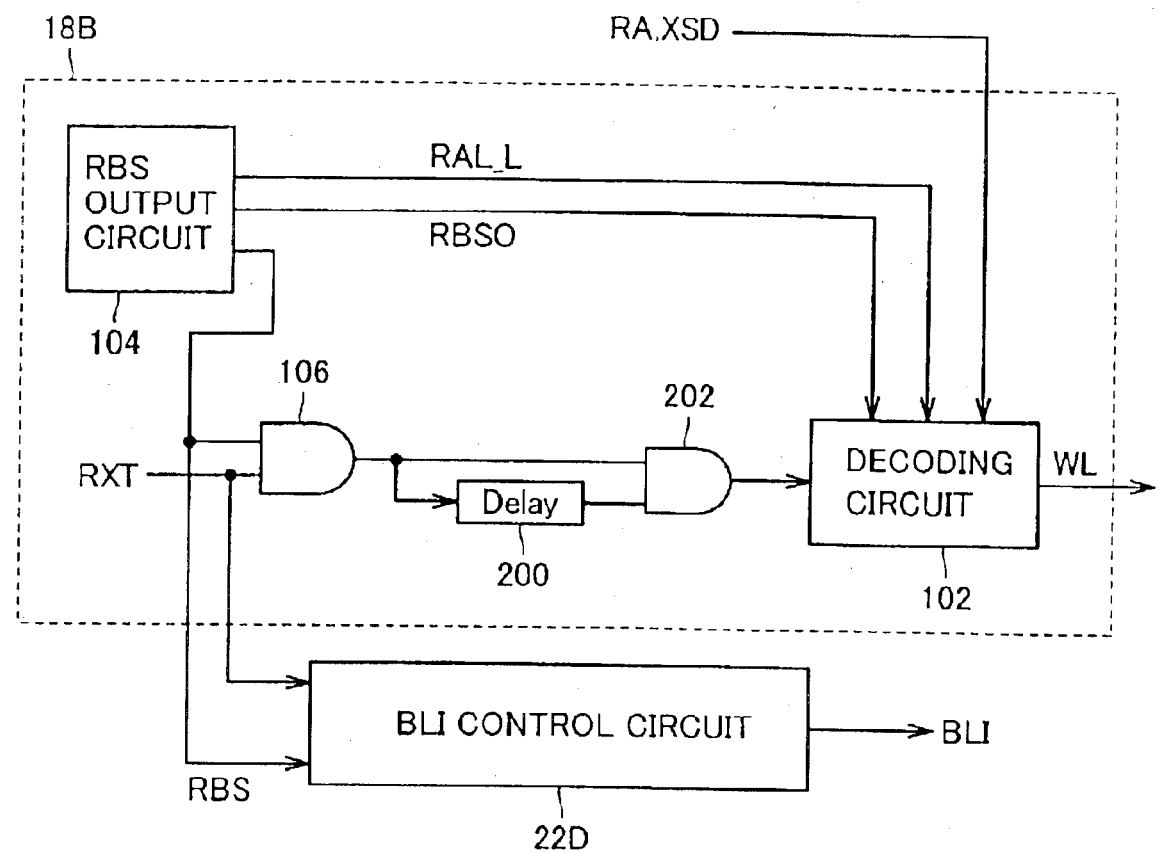
FIG. 20 is a diagram for describing a local control circuit and a BLI control circuit in an eighth embodiment.

FIG. 20 is a diagram for describing connection between the local control circuit and the BLI control circuit in an eighth embodiment.

Referring to FIG. 20, in the eighth embodiment, BLI control circuit 22A in FIG. 15 is replaced with BLI control circuit 22D. Since the configuration of BLI control circuit 22D has been already described by referring to FIG. 18, its description will not be repeated. The operation waveform chart is the same as that of FIG. 16 except that signal BLI-S is replaced with signal BLI and the waveform of signal BLI-N is deleted. Therefore, the description by using the waveform will not be repeated here.

With the configuration as shown in FIG. 20, a control similar to that on signal BLI-S in FIG. 16 is performed. Specifically, without a discrimination between the self refresh mode and the normal mode, as long as the same memory block is continuously accessed, a swing of bit line isolation signal BLI does not generate.

The falling and rising timings of bit line isolation signal BLI are the same as those of signal BLI-S in FIG. 16. Therefore, in a manner similar to the fourth embodiment, timing margins Tf and Tm can be assured. An effect produced by not using an output of a refresh counter is similar to that of the first embodiment.

Ninth Embodiment

Figure 21:
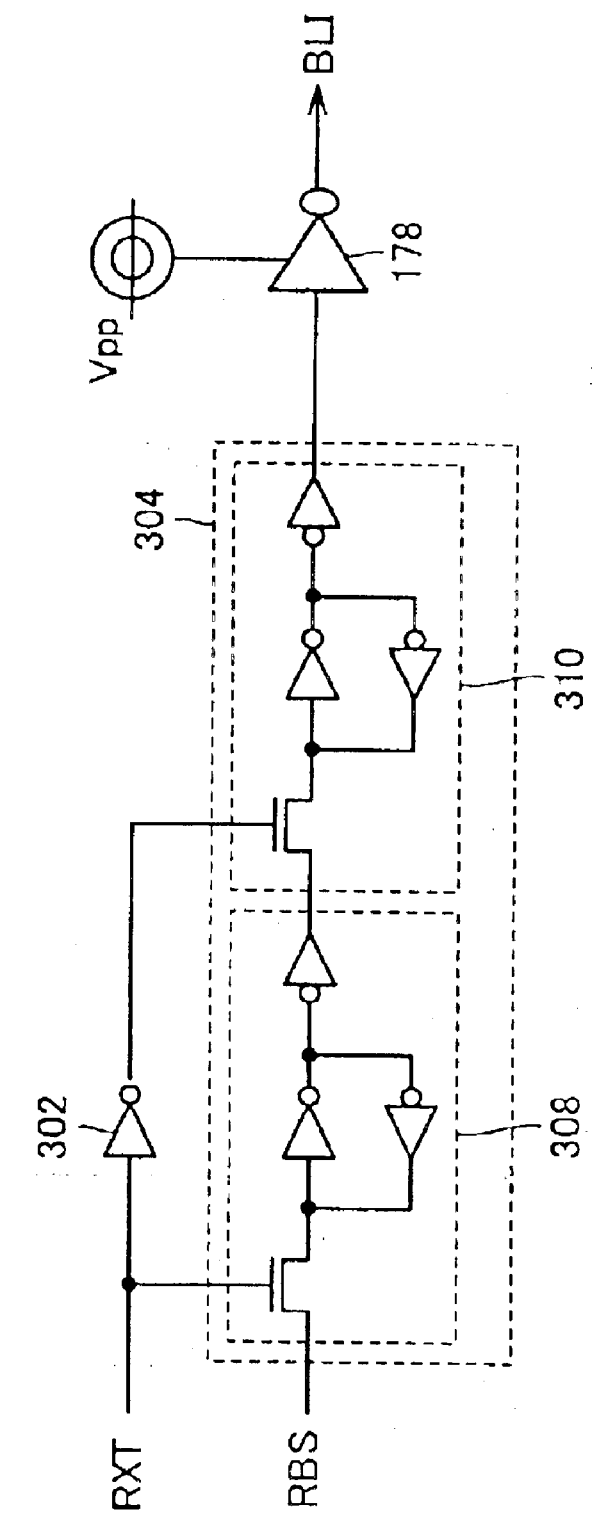
FIG. 21 is a circuit diagram showing the configuration of a BLI control circuit 22E used in a ninth embodiment.

FIG. 21 is a circuit diagram showing the configuration of a BLI control circuit 22E used in a ninth embodiment.

Referring to FIG. 21, BLI control circuit 22E is obtained by replacing latch circuit 176 with a D flip-flop circuit 304 in the configuration of FIG. 17 and adding an inverter 302 for supplying an inversion clock to D flip-flop circuit 304 to the configuration.

Inverter 302 receives and inverts trigger signal RXT. D flip-flop circuit 304 includes: a latch circuit 308 for latching block selection signal RBS when trigger signal RXT becomes H level and holding block selection signal RBS when trigger signal RXT becomes L level; and a latch circuit 310 for latching an output of latch circuit 308 when an output of inverter 302 becomes H level, and holding an output of latch circuit 308 when an output of inverter 302 becomes L level. Since the configuration of each of latch circuits 308 and 310 is similar to that of latch circuit 176 in FIG. 8, its description will not be repeated.

With the configuration as shown in FIG. 21, operations and effects similar to those of the fifth embodiment can be obtained. Further, an effect can be obtained such that, even if noise generates in block selection signal RBS during the period in which trigger signal RXT is at the H level, if the time in which noise generates is other than the rising timing of trigger signal RXT, bit line isolation signal BLI is not influenced.

Tenth Embodiment

Figure 22:
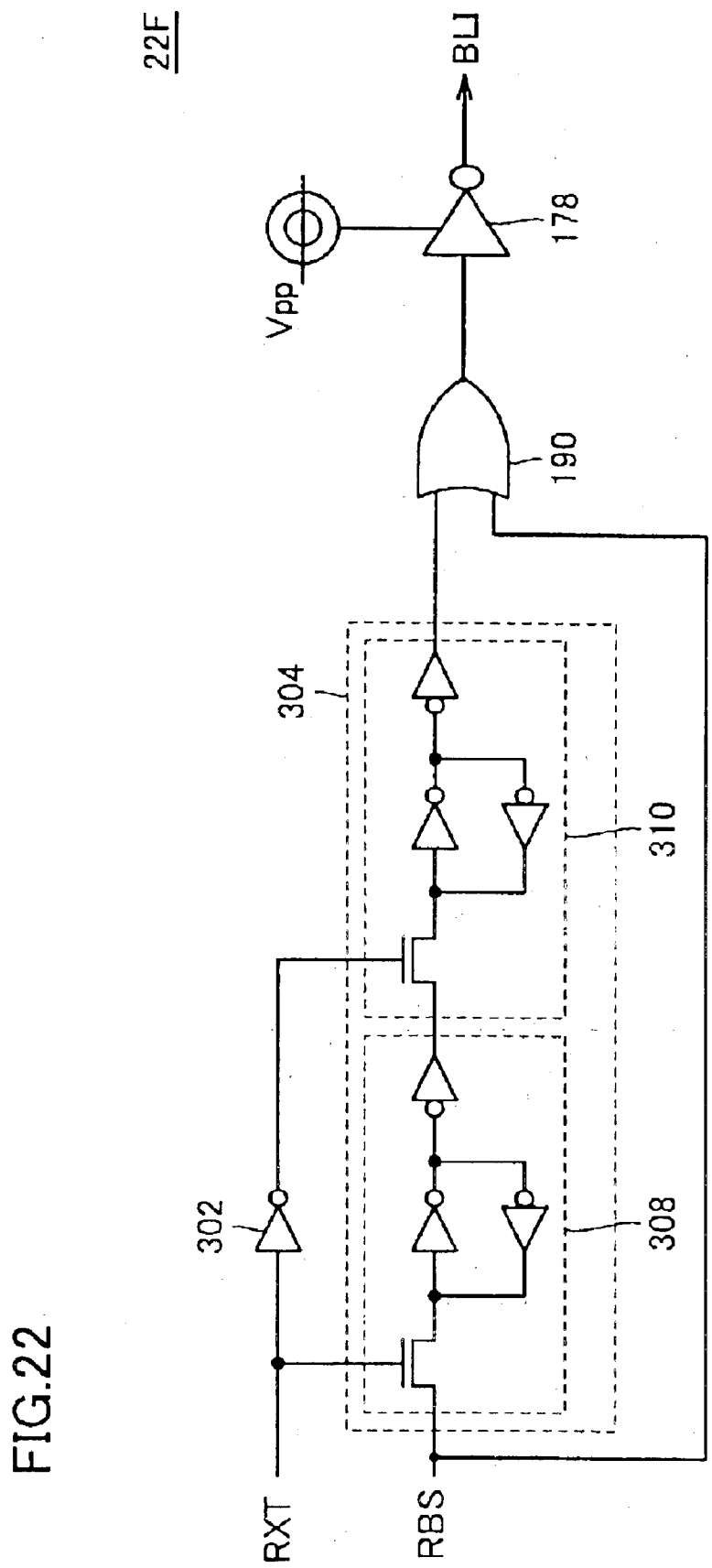
FIG. 22 is a circuit diagram showing the configuration of a BLI control circuit 22F in a tenth embodiment.

FIG. 22 is a circuit diagram showing the configuration of a BLI control circuit 22F in a tenth embodiment.

Referring to FIG. 22, BLI control circuit 22F is obtained by replacing latch circuit 176 in BLI control circuit 22D shown in FIG. 18 with D flip-flop circuit 304. Since the configuration of D flip-flop circuit 304 has been described by referring to FIG. 21, its description will not be repeated. With the configuration as shown in FIG. 22, operations and effects similar to those of the sixth embodiment can be obtained.

Eleventh Embodiment

Figure 23:
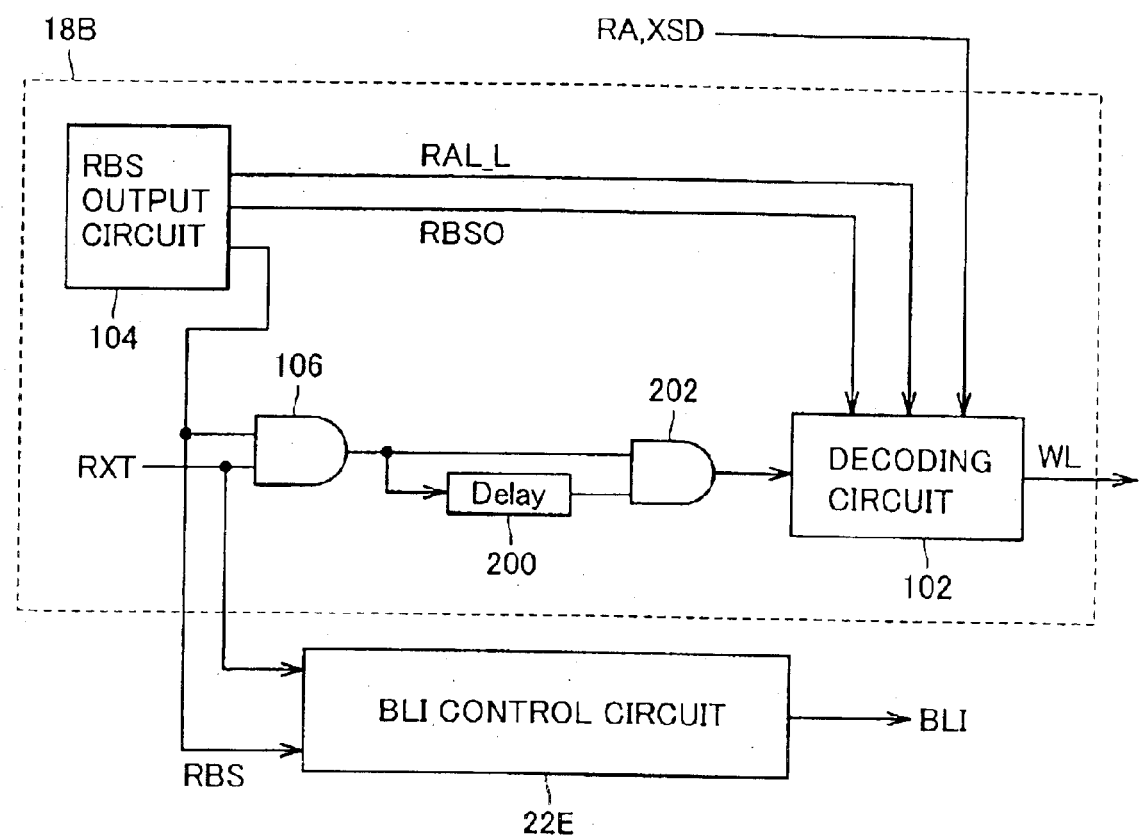
FIG. 23 is a diagram for describing a local control circuit and a BLI control circuit in an eleventh embodiment.

FIG. 23 is a diagram for describing a local control circuit and a BLI control circuit in an eleventh embodiment.

Referring to FIG. 23, in the eleventh embodiment, BLI control circuit 22E is used in place of BLI control circuit 22C in FIG. 19. Since the configuration of BLI control circuit 22E has been described by referring to FIG. 21, its description will not be repeated.

With the configuration as shown in FIG. 23, operations and effects similar to those of the seventh embodiment are obtained and an effect is obtained such that, even if noise generates in block selection signal RBS during the period in which trigger signal RXT is at the H level, if the time in which noise generates is other than the rising timing of trigger signal RXT, bit line isolation signal BLI is not influenced.

Twelfth Embodiment

Figure 24:
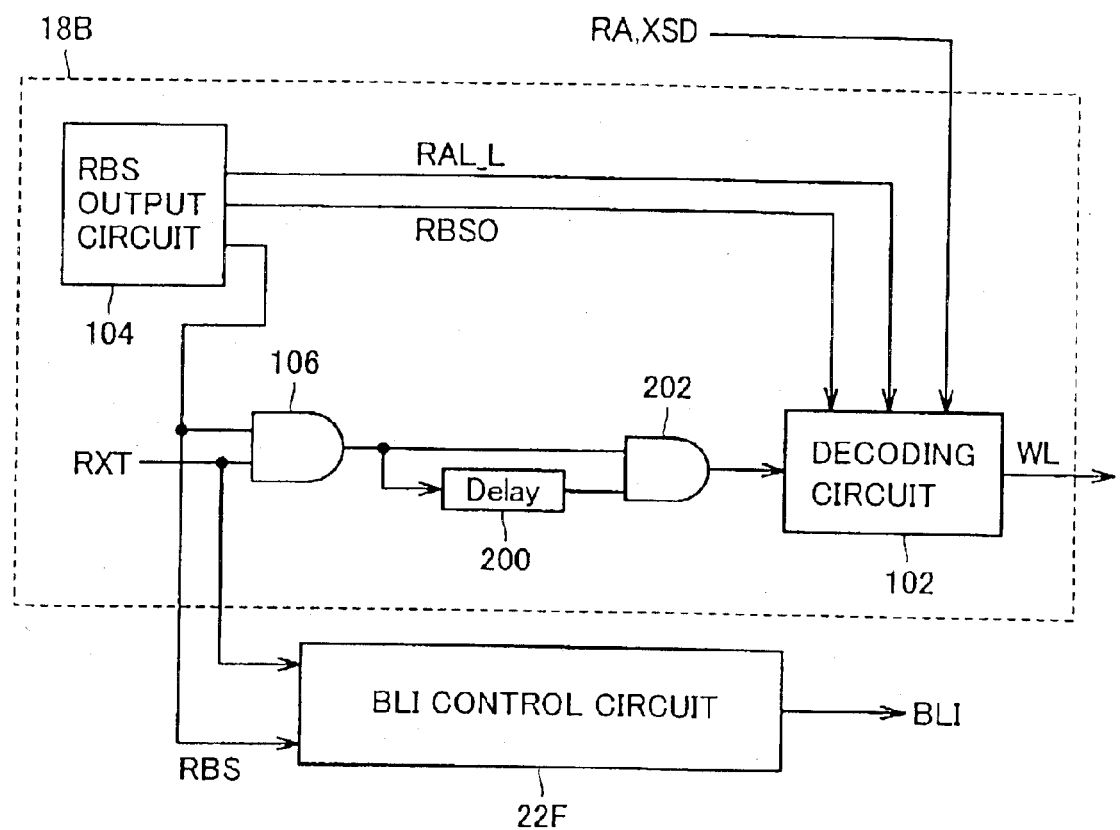
FIG. 24 is a diagram for describing a local control circuit and a BLI control circuit in a twelfth embodiment.

FIG. 24 is a diagram for describing a local control circuit and a BLI control circuit in a twelfth embodiment.

Referring to FIG. 24, this circuit is obtained by replacing BLI control circuit 22D in FIG. 20 with BLI control circuit 22F. With the configuration as shown in FIG. 24, operations and effects similar to those of the eighth embodiment can be obtained.

In the foregoing embodiments, inverter 172 and OR circuit 174 used in the first to fourth embodiments do not always have to be provided in the BLI control circuit but may be provided in local control circuit 18 or central control circuit 17. In this case, the OR circuit and the inverter can be shared. By distributing control signals to the BLI control circuits, the number of OR circuits and inverters can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   first and second memory blocks, each memory block including a plurality of memory cells arranged in a matrix;
   a sense amplifier band shared by said first and second memory block, including a plurality of sense amplifiers;
   an isolation gate circuit for connecting one of said first and second memory blocks to said sense amplifier band and isolating the other of said first and second memory blocks from said sense amplifier band at the time of transmitting data to and receiving data from the one of said first and second memory blocks;

a control circuit for decoding an address signal, outputting first and second section signals indicative or selection of said first and second memory blocks, and outputting a trigger signal respectively indicative of timing of activating a row of either one of said first and second memory blocks in accordance with a command; and an isolation control unit for outputting a first isolation gate signal for isolating said first memory block from said sense amplifier band, and a second isolation gate signal for isolating said second memory block from said sense amplifier band, to said isolation gate circuit in accordance with the trigger signal and the first and second selection signals, said isolation control unit including a first holding circuit for latching and holding the first selection signal in accordance with the trigger signal, and a second holding circuit for latching and holding the second selection signal in accordance wih the trigger signal.

2. The semiconductor memory device according to claim 1, wherein said first memory block includes a first bit line provided in corresponding with one of a plurality of memory cell columns, said second memory block includes a second bit line provided in correspondence with one of a plurality of memory cell columns, and said isolation gate circuit includes a first switch circuit for connecting a first sense amplifier, among said plurality of sense amplifiers, and said first bit line in a standby mode and for isolating said first sense amplifier and said first bit line from each other in accordance with the first isolation gate signal during data transmission and reception, and a second switch circuit for connecting said first sense amplifier and said second bit line in the standby mode and for isolating said first sense amplifier and said second bit line from each other in accordance with the second isolation gate signal during data transmission and reception.

3. The semiconductor memory device according to claim 1, wherein said isolation control unit further includes a first NOR circuit receiving an output of said holding circuit and the first selection signal, and a second NOR circuit receiving an output of said second holding circuit and the second selection signal.

4. The semiconductor memory device according to claim 1, wherein said control circuit further outputs a self refresh signal indicating that an address sinal is generated in accordance with the command, perfoming a memory cell refreshing operation, and said first and second holding circuits enter a state capable of latching the first and second selection signals when the refresh signal is output.

5. The semiconductor memory device according to claim 1, wherein said control circuit includes a central control circuit for outputting an internal address signal in accordance with the address signal and outputting the trigger signal in accordance with the command, and first and second local control circuits corresponding to said first and second memory blocks, respectively, wherein each of said first and second local control circuits includes a selection signal output unit for outputting a corresponding one of the first and second selection signals in accordance with the internal address signal, a delay circuit for outputting a delayed trigger signal delayed from the trigger signal in accordance with the trigger signal, and a decoding circuit activated in accordance with the delayed trigger signal to decode the internal address signal and select a row of a corresponding memory block.

6. The semiconductor memory device according to claim 1, wherein, when the trigger signal is at an active level, each of said first and second holding circuits latches a corresponding selection signal.

7. The semiconductor memory device according to claim 1, wherein, when the trigger signal shifts between an active level and an inactive level, each of said first and second holding circuits latches a corresponding selection signal.

* * * * *